(12) United States Patent
Ousterhout et al.

(10) Patent No.: US 6,312,188 B1
(45) Date of Patent: Nov. 6, 2001

(54) NON-LETHAL, RAPIDLY DEPLOYED VEHICLE IMMOBILIZER

(75) Inventors: John N. Ousterhout, Wilson Creek, WA (US); John P. Marcotullio, Idaho Falls, ID (US); David A. Edmonds, Palm Harbor, FL (US); Randel L. Hoskins, Bothell, WA (US)

(73) Assignee: General Dynamics Ordnance and Tactical Systems, Inc., St. Petersburg, FL (US)

( * ) Notice: Subject to any disclaimer, the term of this patent is extended or adjusted under 35 U.S.C. 154(b) by 0 days.

(21) Appl. No.: 09/290,850

(22) Filed: Apr. 13, 1999

Related U.S. Application Data

(63) Continuation-in-part of application No. PCT/US98/18651, filed on Sep. 4, 1998, which is a continuation-in-part of application No. 09/008,978, filed on Jan. 20, 1998, now Pat. No. 5,993,104, which is a continuation of application No. 08/672,148, filed on Jun. 27, 1996, now Pat. No. 5,829,912.
(60) Provisional application No. 60/086,711, filed on May 26, 1998.

(51) Int. Cl.⁷ ............................ E01F 13/00; E01F 15/00; E04H 17/00; E06B 11/00
(52) U.S. Cl. .................... 404/6; 49/133; 49/34; 49/9; 256/1; 256/13.1
(58) Field of Search ............................ 404/6; 49/131.34, 49/133, 9; 256/13.1, 1

(56) References Cited

U.S. PATENT DOCUMENTS

| | | | |
|---|---|---|---|
| 1,929,859 | * 10/1933 | Strauss | 404/6 |
| 2,237,106 | * 4/1941 | Minert | 404/6 |
| 2,440,574 | * 4/1948 | Cotton | 244/110 R |
| 2,450,328 | * 9/1948 | Cotton | 244/110 R |
| 2,465,936 | * 3/1949 | Schultz | 244/110 R |
| 4,715,742 | * 12/1987 | Dickinson | 404/6 |
| 4,893,119 | * 1/1990 | Nasatka | 340/928 |
| 4,922,655 | * 5/1990 | Seal | 49/131 |
| 5,054,237 | * 10/1991 | Kapala et al. | 49/35 |
| 5,310,277 | * 5/1994 | Uotila | 404/6 |
| 5,624,203 | * 4/1997 | Jackson et al. | 404/6 |
| 5,762,443 | * 6/1998 | Gelfand et al. | 404/6 |

* cited by examiner

Primary Examiner—Thomas B. Will
Assistant Examiner—Gary S. Hartmann
(74) Attorney, Agent, or Firm—Wiggin & Dana

(57) ABSTRACT

There is disclosed a device and associated method for impeding the motion of a land vehicle travelling along a pathway on a terrain surface. First and second supports are positioned at first and second sides of the pathway, respectively, each capable of being actuated from a compressed condition to an extended condition. A propulsion system is effective to actuate the supports. A barrier extends between the supports at a mean first height that is effective to permit passage of a vehicle when the supports are compressed and supported by each support at a mean second height effective to impede passage of the vehicle when the supports are extended. When the supports are compressed, vehicles pass over the barrier unimpeded. When the supports are extended, the barrier impedes the motion of a vehicle travelling along the pathway. At least one deceleration cable mechanically couples the barrier to a brake system.

15 Claims, 18 Drawing Sheets

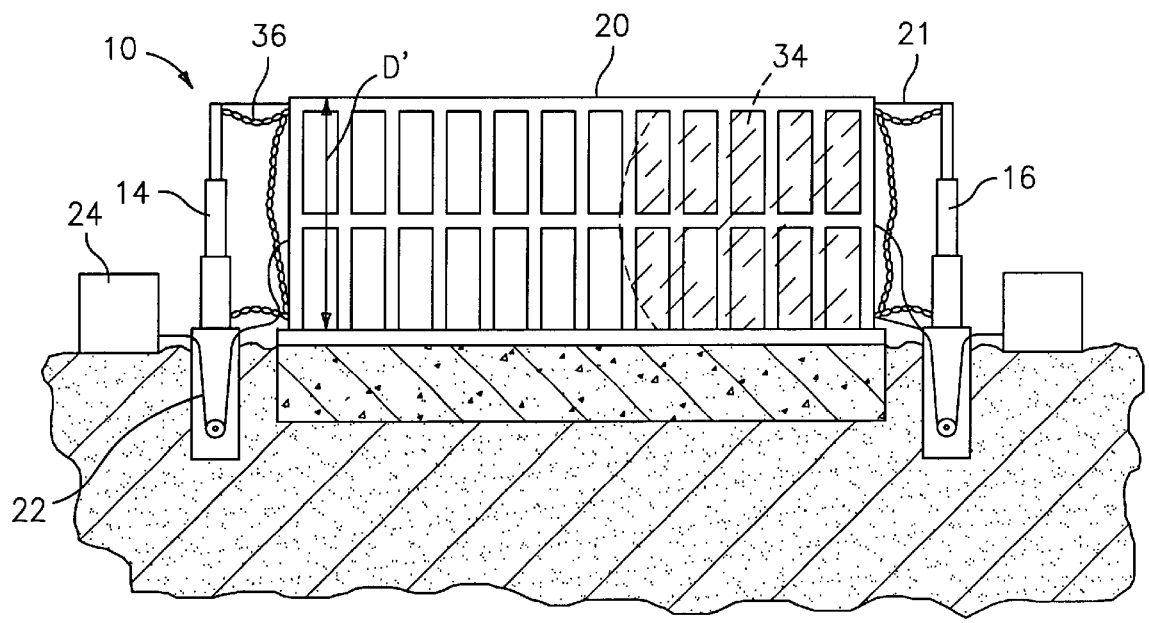
FIG. 4
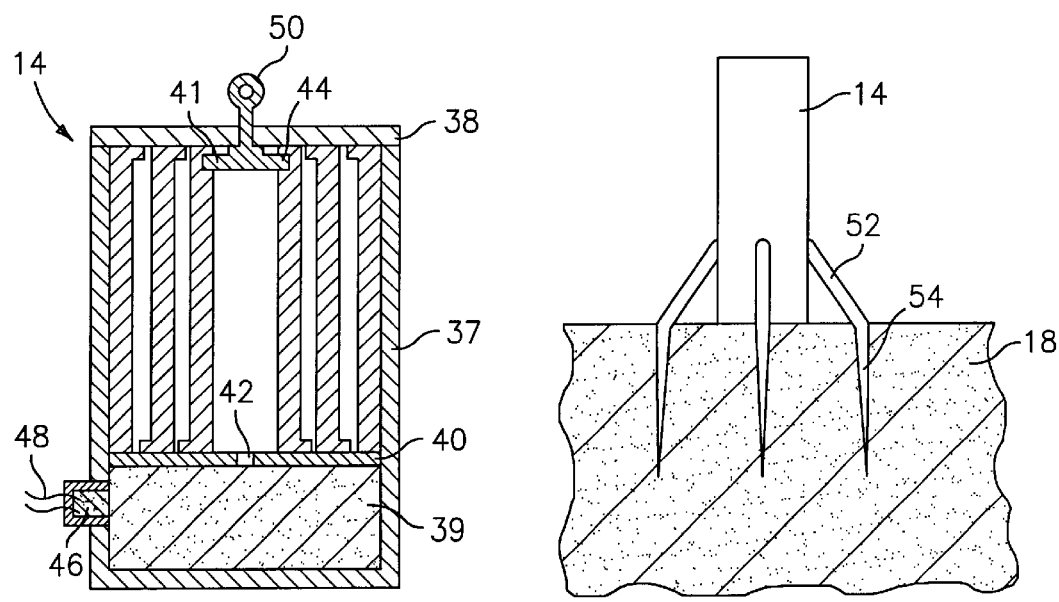
FIG. 5
FIG. 6

NON-LETHAL, RAPIDLY DEPLOYED VEHICLE IMMOBILIZER

CROSS-REFERENCE TO RELATED APPLICATIONS

This application is a continuation-in-part of PCT/US98/18651, filed Sep. 4, 1998 which claims priority to provisional patent application Ser. No. 60/086,711, filed May 26, 1998. This application is a continuation-in-part of Ser. No. 09/008,978, filed Jan. 20, 1998, now U.S. Pat. No. 5,993,104, which is a continuation of Ser. No. 08/672,148, filed Jun. 27, 1996 now U.S. Pat. No. 5,829,912.

U.S. GOVERNMENT RIGHTS

Portions of the invention may have been made with U.S. Government support under contract DAAE 30-96-C-0003 awarded by the United States Army. The U.S. Government may have certain rights in the invention.

BACKGROUND OF THE INVENTION (1) Field of the Invention

This invention relates to a device for impeding the motion of a land vehicle.

(2) Description of the Related Art

The military and police officials are at times required to stop a moving land vehicle. For example, the military may be called on to stop a truck laden with explosives. The police may be called on to stop a speeding car containing suspected criminals. It is desirable that the occupants of these vehicles, that may include hostages, not be injured by immobilization of the vehicle. Therefore, immobilization by conventional methods such as road blocks using other vehicles and tire puncturing is not acceptable.

Devices to stop a moving land vehicle without injury to the occupants are disclosed in U.S. Pat. No. 4,576,507 to Terio et al. and in U.S. Pat. No. 4,824,282 to Waldecker. The Terio et al. patent discloses a pair of I-beams disposed on opposing sides of a roadway supported in an underground enclosure. Cables supported by shock absorbers extend between the I-beams. When the barrier is actuated, the I-beams rise from the underground enclosure, extending the cables across the roadway. The Waldecker patent discloses a plurality of fabric cylinders disposed in a trench extending across a roadway. A net is supported on one side of these cylinders. When actuated, gas generators fill the cylinders causing them to rise and form a barrier across the roadway. Impact with the gas-filled cylinders serves as a primary braking means to impede the land vehicle. The net forms a secondary braking means.

While the above vehicle immobilization systems are useful, they have the disadvantage of being complex, heavy and immobile. They are useful for protection of a fixed target, but are less useful for protecting temporary targets, such as an arena being visited by a head of state. They are also not useful for rapid deployment in a remote site, such as encountered by police seeking to stop the escape of criminals.

There exists, therefore, a need for a transportable, rapidly deployed, vehicle immobilization system that does not suffer from the disadvantages of the prior art.

BRIEF SUMMARY OF THE INVENTION

Accordingly, it is an object of the invention to provide a vehicle immobilization system that is both transportable and rapidly deployed. It is a feature of this vehicle immobilization system that telescoping supports are rapidly extended by a propulsion unit. The telescoping supports may be either embedded in the ground or anchored above ground. A barrier extending between the telescoping supports permits free travel of land vehicles when the telescoping supports are compressed, but stops moving vehicles with a deceleration force of less than 2 g (i.e., twice the force or acceleration due to gravity at sea level on the earth; 1 g 9.8 m/s/s) when the telescoping supports are extended.

Among the advantages of the vehicle immobilization system of the invention are that the system is both lightweight and transportable. The system is readily deployed as and where needed. A further advantage is that a moving land vehicle is not destructively immobilized facilitating the safe removal of the occupants.

In accordance with the invention, there is provided a transportable device for impeding the motion of a land vehicle that is travelling along a pathway. This device has first and second supports positioned at first and second sides of the pathway, respectively, each capable of being actuated from a compressed condition to an extended condition. A propulsion system is effective to actuate the supports. A barrier extends between the supports at a mean first height that is effective to permit passage of vehicles when the supports are compressed and held by each support at a mean second height effective to impede passage of a vehicle when the supports are extended. When the supports are compressed, vehicles pass over the barrier unimpeded. When the supports are extended, the barrier impedes the motion of a vehicle traveling along the pathway. At least one deceleration cable mechanically couples the barrier to a brake system.

In specific implementations of the invention, each support may have a housing, a first telescoping element, and a second telescoping element. The first telescoping element is moveable upward relative to the housing upon actuation of the associated support. The second element is concentric with the first element and moveable upward relative to the first element to reach an extended height upon actuation of the associated support. The barrier is supported by the second element of each support. The propulsion system may comprise a rapidly combusting chemical mix. The supports may be positioned so that their respective housings are atop and not substantially sunk into the ambient terrain so that majorities of the first and second telescoping elements are positioned above the terrain when the supports are in the compressed condition. The supports may each have a plurality of anchors effective to anchor the supports against force transmitted from the impact of the vehicle with the barrier. The anchors may be at least partially embedded in the terrain. The telescoping elements may be inner and outer intermeshed cylinders.

Prior to deployment, the barrier may be housed in a barrier enclosure. The barrier enclosure may have a top including first and second hinged cover elements. The cover elements may be moveable from a closed condition for storing the barrier beneath the top and protecting the barrier from vehicles passing over the enclosure to an open condition in which the barrier may be deployed upward through a gap between the cover elements.

In the closed condition, the cover elements may be separated by a convoluted separation line defining intermeshing inboard edges of the first and second cover elements. Such edges may be directed generally upward in the open condition and effective to puncture the tires of a vehicle passing over the enclosure. The enclosure may have a generally trapezoidal cross-section.

The deceleration cables may be configured to cross behind a vehicle which has collided with the barrier so as to extend along first and second sides of such vehicle and impede opening of the doors of such vehicle sufficiently to impede escape of occupants of the vehicle.

The above stated objects, features and advantages will become more apparent from the specification and drawings that follow.

BRIEF DESCRIPTION OF THE DRAWINGS

FIG. 4 illustrates in cross-sectional representation the device of FIG. 1 subsequent to deployment.

FIG. 5 illustrates in cross-sectional representation a telescoping support in accordance with the invention.

FIG. 6 illustrates in partial cross-section a mechanism for anchoring a telescoping support above ground.

Like reference numbers and designations in the several views indicate like elements.

DETAILED DESCRIPTION

Figure 1:
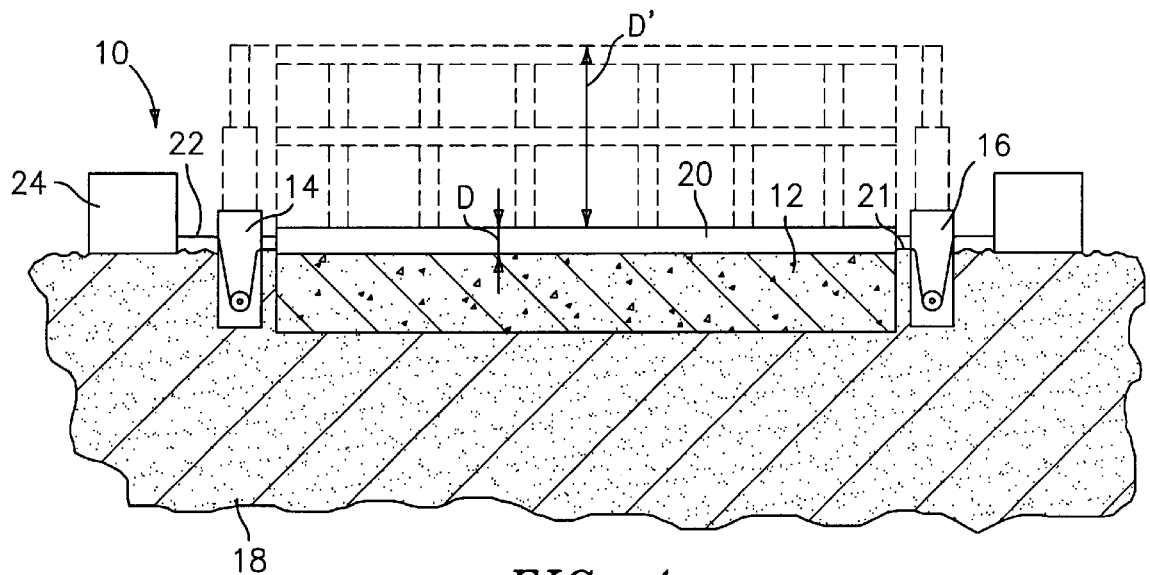
FIG. 1 illustrates in partial cross-section the vehicle immobilization device of the invention prior to deployment.

FIG. 1 illustrates, in partial cross-sectional representation, a transportable device 10 for impeding the motion of a vehicle that is travelling along a pathway 12. While the pathway 12 is illustrated as a paved road, the invention is equally applicable to other pathways such as unpaved roads, rails and narrow waterways, such as canals.

The device 10 includes a first telescoping support 14 and a second telescoping support 16. The first telescoping support 14 and second telescoping support 16 are anchored to opposing sides of the pathway 12. Such anchoring may be by partial embedding in the ground 18 as illustrated in FIG. I or by explosively driven anchors as illustrated in FIG. 5.

The telescoping supports 14, 16 support a barrier 20 by a breakaway cord 21 or other detachable connection. When compressed, the telescoping supports 14, 16 extend the barrier 20 across the pathway 12 at a mean first height, D, that is typically between 0 cm (0 inches) (flush with the pathway) and 15 cm (6 inches). Preferably, D is from 0 cm (0 inches) to 5 cm (2 inches).

Preferably, both the first telescoping support 14 and the second telescoping support 16 are at the same height to support the barrier uniformly across the pathway 12. When extended by a suitable propulsion system, the first telescoping support 14 and second telescoping support 16 raise the barrier 20 to a height, D' (indicated as an alternate position in FIG. 1) above pathway 12.

The barrier 20 extends between the telescoping supports 14, 16. When the telescoping supports 14, 16 are compressed, the height of the barrier 20 above the pathway 12 is sufficiently low to permit passage of land vehicles, preferably, D is less than 2 inches. When the telescoping supports 14, 16 are extended, the barrier 20 is at a height effective to impede passage of vehicles. D' is dependent on the vehicle to be stopped, including the tire size and vehicle weight. Preferably, D' is at least equal to the diameter of the vehicle tires. For an all terrain vehicle or a truck, D' is more than 91 cm (36 inches) and preferably from about 122 cm (48 inches) to about 203 cm (80 inches).

The device 10 further includes at least one deceleration cable 22 that mechanically couples the barrier 20 to a brake system 24. The deceleration cable is an extended length, high strength, flexible strand such as a rope, cable, chain or webbing that transfers momentum imparted by the land vehicle from the barrier 20 to the brake system 24. The deceleration cable 22 has a yield strength and an elongation capacity sufficient to avoid breaking when the barrier 20 engages a moving vehicle. Since the barrier 20 may be called on to stop a moving truck having a weight of several tons, the yield strength of the deceleration cable 22 should be sufficient to stop that vehicle. High strength nylon rope and steel cable are exemplary. A preferred material for the deceleration cable 22 is 2 inch wide webbing formed from nylon.

The momentum of the vehicle is dissipated by the brake 22 to non-destructively stop the land vehicle.

Figure 2:
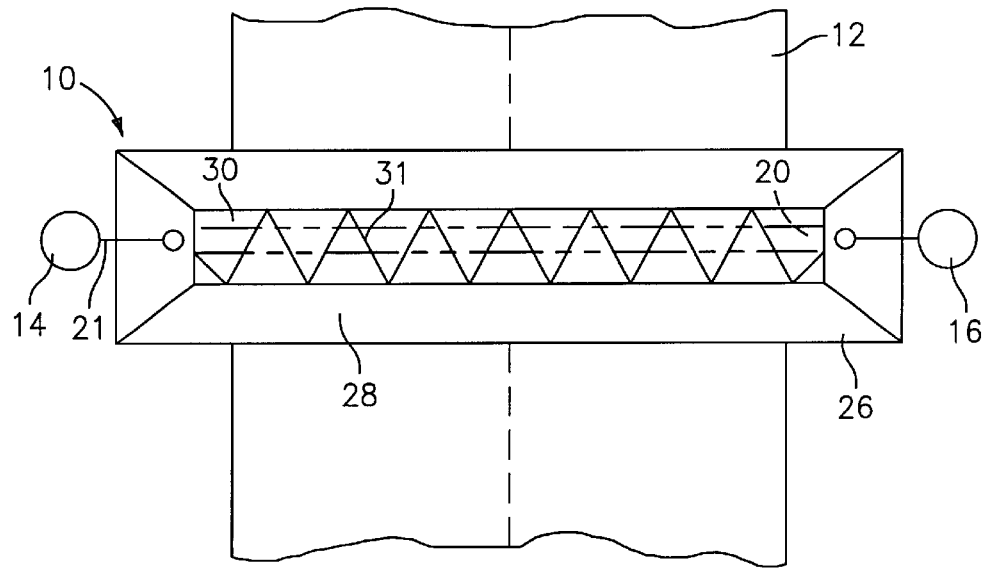
FIG. 2 illustrates in top isometric view a portion of the device of FIG. 1.

FIG. 2 illustrates in top isometric view, the device 10 prior to deployment. The telescoping supports 14, 16 are anchored to opposing sides of the pathway 12 and support the barrier 20 (shown in phantom). The barrier 20 is optionally housed within a barrier enclosure 26 that both protects the barrier from damage and facilitates the unimpeded passage of moving land vehicles.

The barrier enclosure 26 has the shape of a conventional speed bump, such as hemispherical or trapezoidal. The trapezoidal barrier enclosure 26 illustrated in FIG. 2 has gradually sloped surfaces 28 to guide a moving land vehicle over the barrier enclosure 26. Preferably, the barrier enclosure is a minimum height necessary to enclose the barrier 20. Typically, the barrier enclosure will extend from about 0 inch to about 6 inches above the pathway 12 and the surfaces 28 form an angle of between 0° and 15° with the pathway 12.

The barrier enclosure 26 is formed from any material having sufficient strength to withstand the passage of heavy land vehicles. Suitable materials include steel, aluminum and fiberglass. A top surface 30 is designed to avoid impeding deployment of the barrier 20. Preferably, the top surface 30 is hinged for accelerated opening. The top surface 30 may comprise two pieces separated by a jagged line 31. The jagged line forms pointed spikes or prongs on opening that are effective to pierce the tires of the vehicle.

Figure 3:
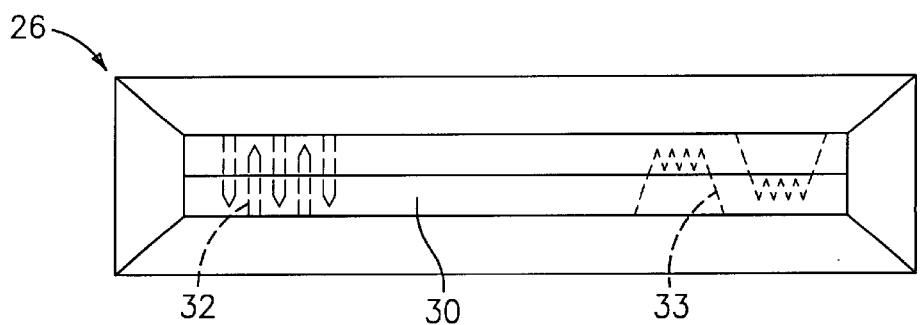
FIG. 3 illustrates mechanisms for piercing the tires of a vehicle.

FIG. 3 illustrates alternative mechanisms to pierce the tires of the vehicle to be stopped. The barrier enclosure 26 includes one or more piercing devices such as pointed spikes 32 or cutting blades 33 that are deployed when the top surface 30 opens.

FIG. 4 illustrates the device 10 with telescoping supports 14, 16 deployed and the barrier 20 at the mean second height D' above the pathway 12. The barrier 20 at this height is effective to impede passage of a land vehicle.

The barrier 20 is any structure effective to stop the travel of a vehicle. Suitable structures for the barrier 20 include cables, webs and bands running either horizontally or vertically. In a preferred embodiment, the barrier 20 is a mesh or net having bands of sufficient strength to avoid breaking when engaging the moving vehicle. Suitable materials for the bands include high tenacity nylon and polyester. A suitable webbing has these bands with a width of from 1 inch to 4 inches and maximum openings of about 12 inches separating the bands.

The webbing forming the barrier 20 is preferably opaque or translucent, or supports an opaque or translucent film, such as a fabric. This obstructs the view of the occupants in the stopped vehicle increasing the safety of the personnel that deployed the vehicle stopping device.

In addition to the breakaway cord 21 and the deceleration cable 22, an elastic cord 36, such as a "bungee cord" is provided. The elastic cord is fastened near the top and bottom of the barrier to hold the webbing taut and open during deployment.

Deployment of the barrier 20 is by extension of the telescoping supports 14, 16. A compressed telescoping support 14 is illustrated in cross-sectional representation in FIG. 5. The support 14 is contained within an enclosure 37, typically manufactured from steel or aluminum, having a frangible or hinged cover 38. The housing 37 is a closed cylinder or other confined shape. A propulsion system 39 is contained adjacent to the closed end of the housing 37. A barrier 40 such as a thin strip of steel separates the propulsion system 39 from a support top plate 41. Activation of the propulsion system 39 communicates a propellant through an aperture 42 extending through barrier 40, driving the support top plate 41 upwards through the cover 38. The support top plate 41 engages the innermost of a plurality of intermeshed cylinders 44 that telescope outward to the second height, D'.

The propulsion system 39 is any suitable force generating composition such as compressed air or pressurized hydraulic fluid. Any gas generating chemical composition, such as a nitrocellulose/ nitroglycerine based composition or an ammonium nitrate based composition may be employed.

Preferably, the propulsion system 39 is a rapidly combusting mix that is actuated by a conventional initiator 46. Rapidly combusting mixes are preferred over mechanically, hydraulically or pneumatically actuated systems because the rate of deployment of the telescoping supports is much quicker and the required volume of force generating composition is much less. The initiator 46 is actuated by an electrical signal from leads 48.

The electrical signal may be generated by any suitable signal source such as a manually operated button, a pressure activated sensor embedded in the pathway or a light beam extending across the pathway.

A control system may be used to detect the approaching vehicle and to determine speed and distance. Suitable devices to determine these parameters include pressure sensors embedded in the pathway, electro-optical sensing devices and electromagnetic radiation sensing devices. The control system erects the barrier at the appropriate time, based on vehicle speed, to insure the vehicle can not pass over the device and that the driver has inadequate time to take evasive action to avoid the barrier.

The rapidly combusting mix, that is preferably an ammonium nitrate based propellant, when initiated generates a pressure effective to fully deploy the telescoping support 14 in less than 5 seconds. Preferably, the telescoping support 14 is fully deployed in under 1 second and most preferably in from 0.1 to 0.4 seconds.

For a telescoping support having an inside diameter of about 8 cm (3 inches) that extends from a compressed height of about 0.6 m (2 feet) to an extended height of up to 2.6 m (8 feet), it is anticipated that about 100 grams of the ammonium nitrate based propellant is required.

The intermeshing cylinders 44 are formed from any material having sufficient strength to withstand forces imposed by a vehicle striking the barrier that is connected to the intermeshing cylinders, such as through connector 50. Suitable materials for the intermeshing cylinders include steel and aluminum.

The telescoping supports 14 are anchored to avoid dislocation when the barrier engages a moving vehicle. The telescoping supports may be embedded in the ground, as illustrated in FIG. 4 and, optionally, are supported by a cement block (not shown) if the vehicle immobilization device is to be permanently installed at a fixed location. If mobility is desired, then a telescoping support 14 as illustrated in FIG. 5 is employed. The telescoping support is anchored through tether lines 52 by explosively driven anchors 54, stakes driven into the ground, buried anchors or other suitable means. Generally, from about 2 to about 8 anchors are effective to prevent dislocation of the telescoping support 14 when the barrier is engaged with a moving land vehicle.

Figure 7:
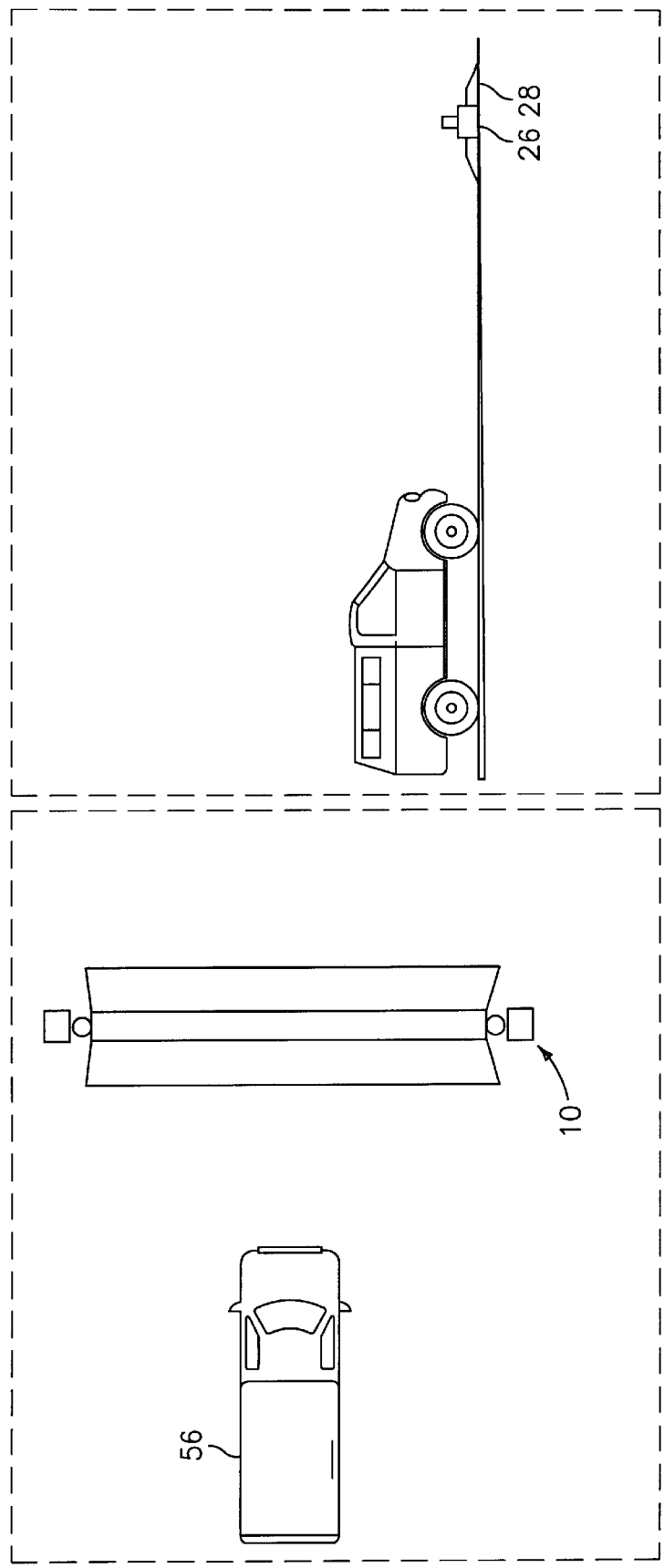
FIGS. 7 through 11 schematically illustrate the operation of the vehicle immobilization device of the invention.

FIGS. 7 through 11 illustrate the operation of the vehicle immobilizer system of the invention. In FIG. 7, a vehicle 56 approaches the device 10 that is in the pre-deployment mode. The sloped surfaces 28 of the barrier enclosure 26 permit passage by non-threatening vehicles.

Figure 8:
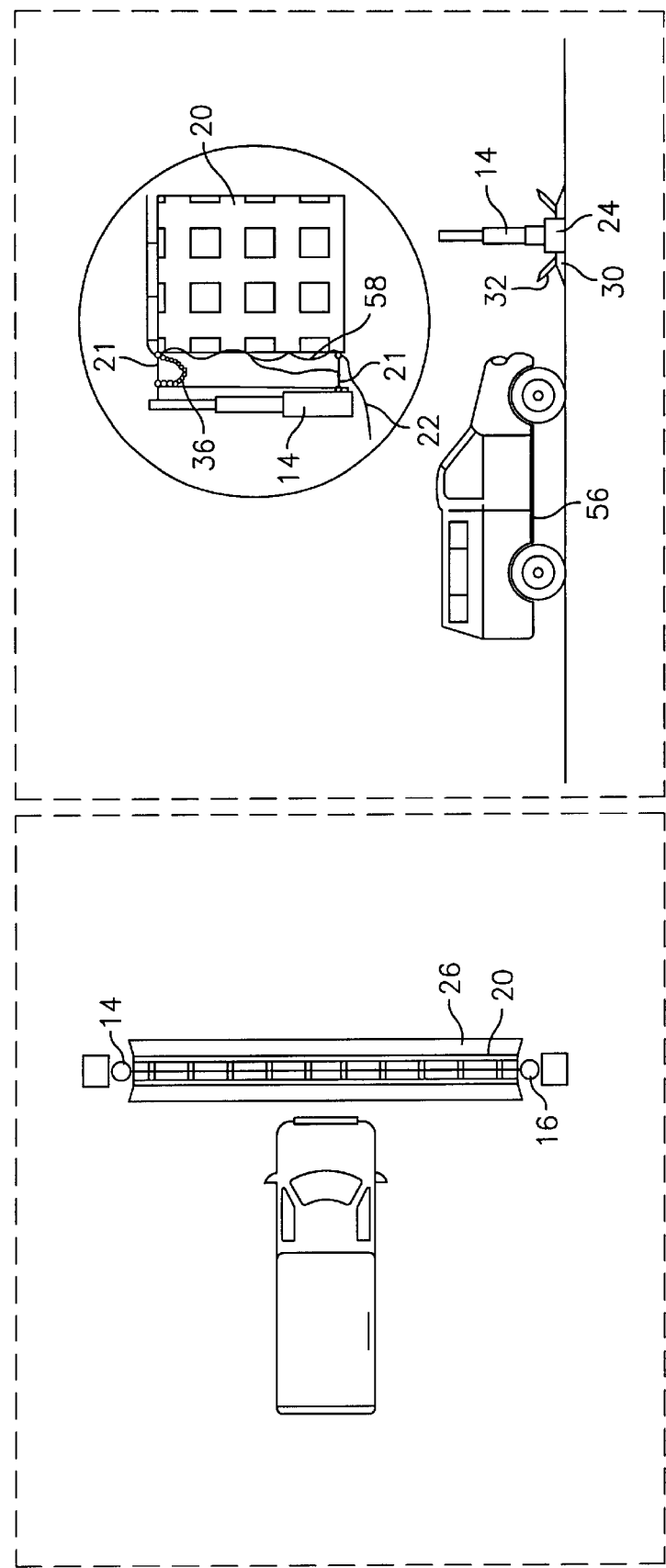

The approach of a hostile vehicle causes deployment of the barrier 20 as illustrated in FIG. 8. The top surface 30 of the barrier enclosure 26 opens and, optionally, presents tire piercing spikes 32 to the vehicle 56. The telescoping supports 14, 16 rise to the upright position deploying the barrier 20 to a height effective to stop the vehicle 56.

The insert to FIG. 8 shows the attachment of the barrier 20 to the telescoping support 14. Breakaway cords 21 initially fasten the barrier to the telescoping supports so that raising of the supports deploys the barrier. Optionally, elastic cords 36 are attached to the top and the bottom of the barrier 21.

A harness 58 is disposed between the top and bottom elastic cords. A deceleration cable 22 is attached to the barrier 20 through the harness 58 and couples the barrier to the brake system 24.

Figure 9:
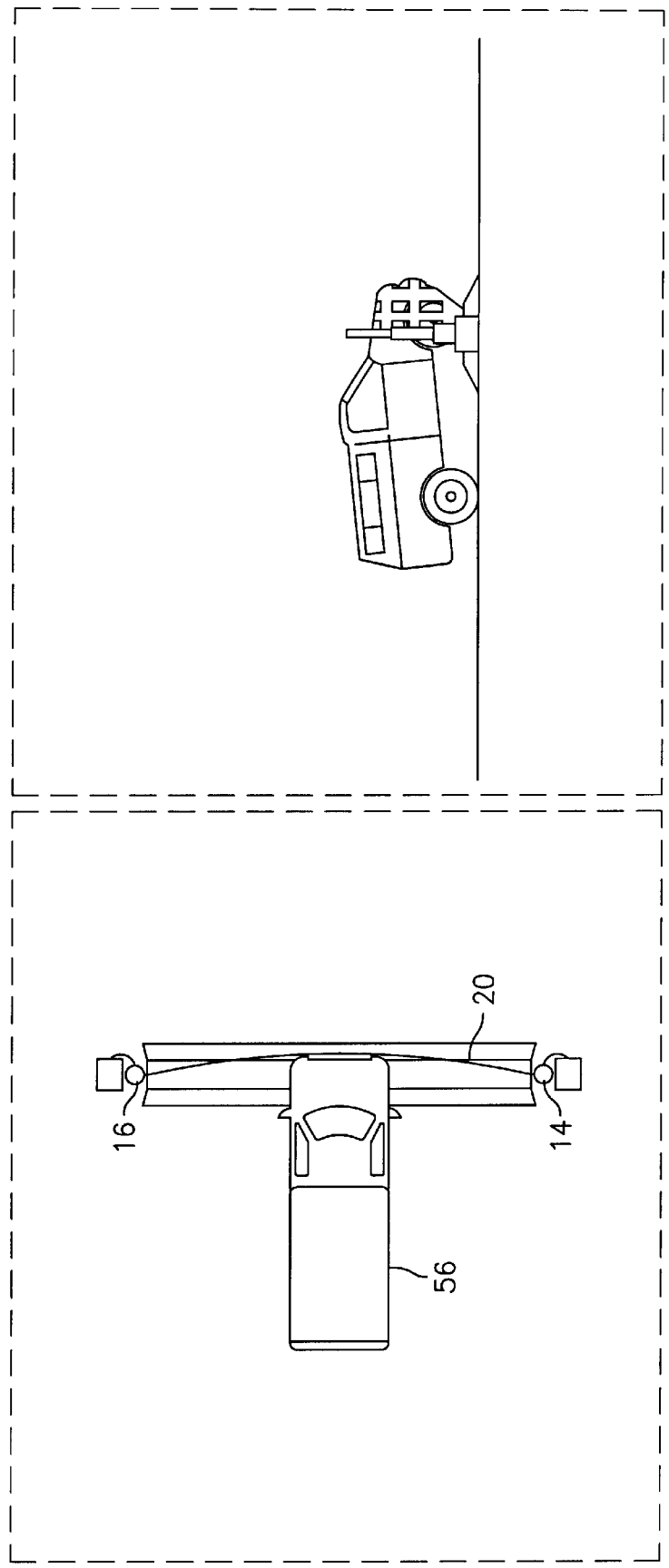

FIG. 9 illustrates the vehicle 56 impacting the barrier 20. The breakaway cords snap freeing the barrier 20 from the telescoping supports 14, 16. The barrier is held taut against the vehicle 56 by the elastic cord.

Figure 10:
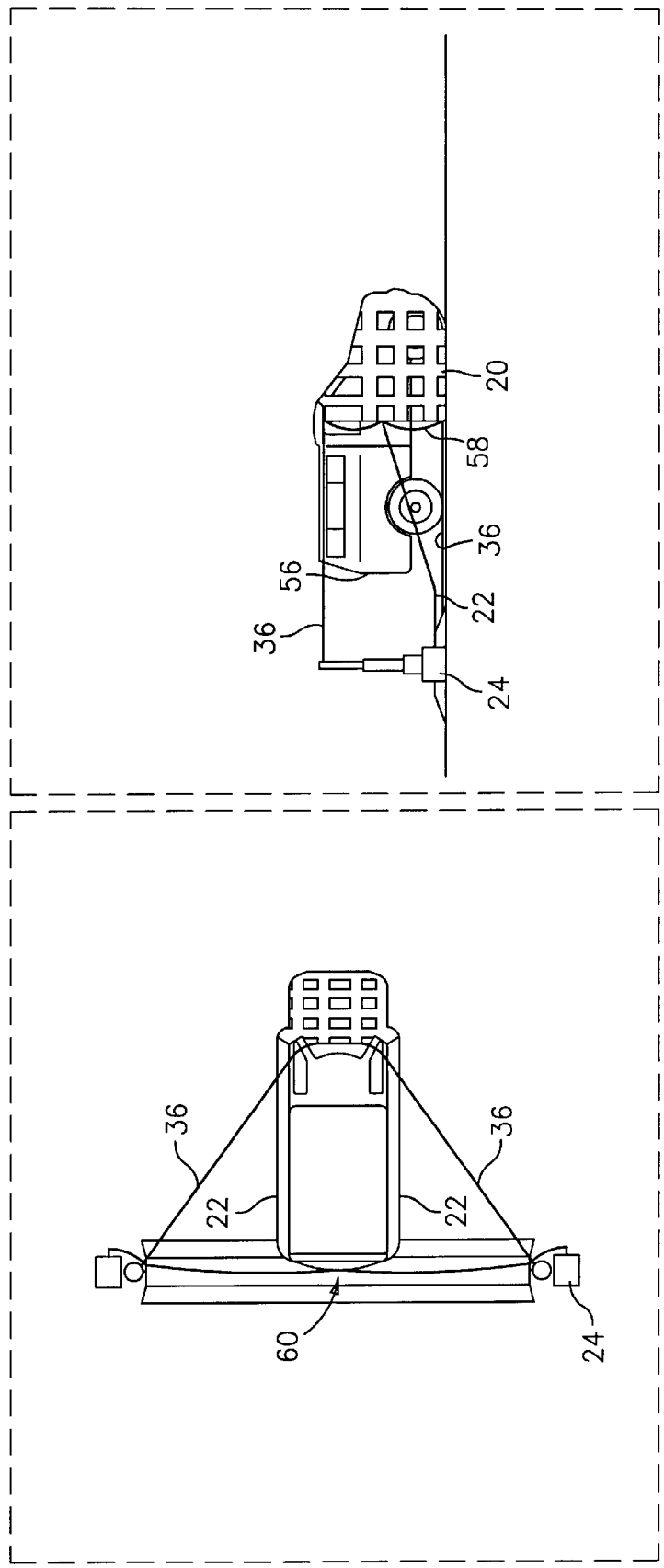

FIG. 10 illustrates the barrier 20 fully engaged against the front of the vehicle 56. Elastic cords 36 maintain the barrier against the vehicle. Deceleration cables 22, optionally supported by harness 58, is deployed from the brake system 24. The deceleration cables extend along the side of the vehicle 56 to prevent opening of the vehicle doors and the escape of the occupants. The deceleration cables preferably cross 60 at the rear of the vehicle to prevent escape by going in reverse.

Figure 11:
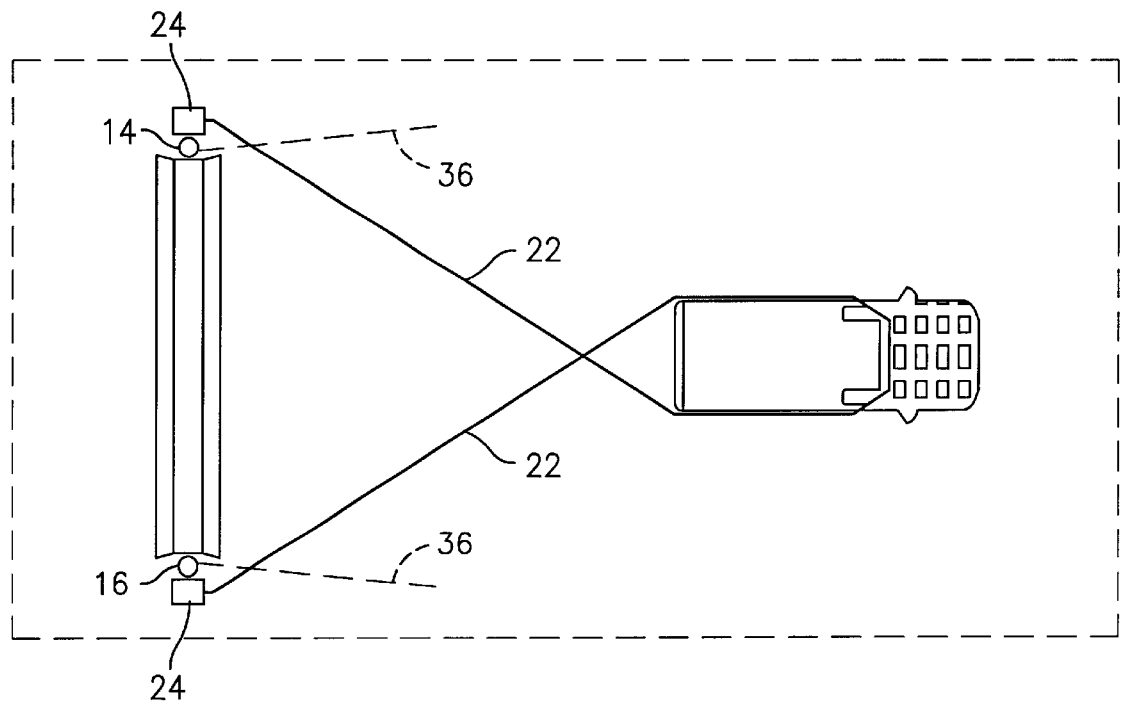
Figure 11:
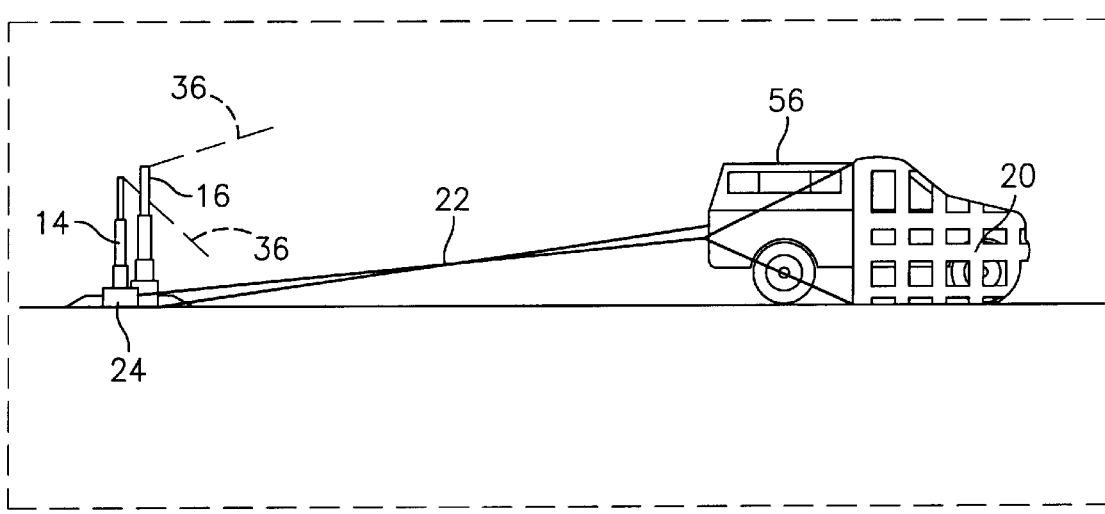

FIG. 11 illustrates the barrier 20 fully engaged against the vehicle 56, obstructing both the door and windshield of the vehicle. The elastic cords 36 have snapped engaging the deceleration cables 22 that are coupled to the braking system 24. The deceleration cables 22 pass through the telescoping supports 14, 16 to one or more brake systems 22. The brake systems absorb the force communicated to the barrier 20 by the vehicle 56 and gradually bring the vehicle to a stop.

The brake system 24 applies a constant rate of mechanical braking to the vehicle 56 at a relatively low deceleration rate, typically between 4.9 m/s/s and 29.4 m/s/s (0.5 g and 3 g) and preferably between 1 g and 2 g.

To stop a vehicle travelling at 27 m/s (60 miles per hour (88 feet/second)) with a constant deceleration of 9.8 m/s/s (1 g) requires a distance of 37 m (120 feet). The deceleration cables combined with the braking system therefore have a sufficient length for a stopping distance of at least 18 m (60 feet), for 19.6 m/s/s (2 g) deceleration, and preferably, the effective length is at least 37 m (120 feet).

Figure 12:
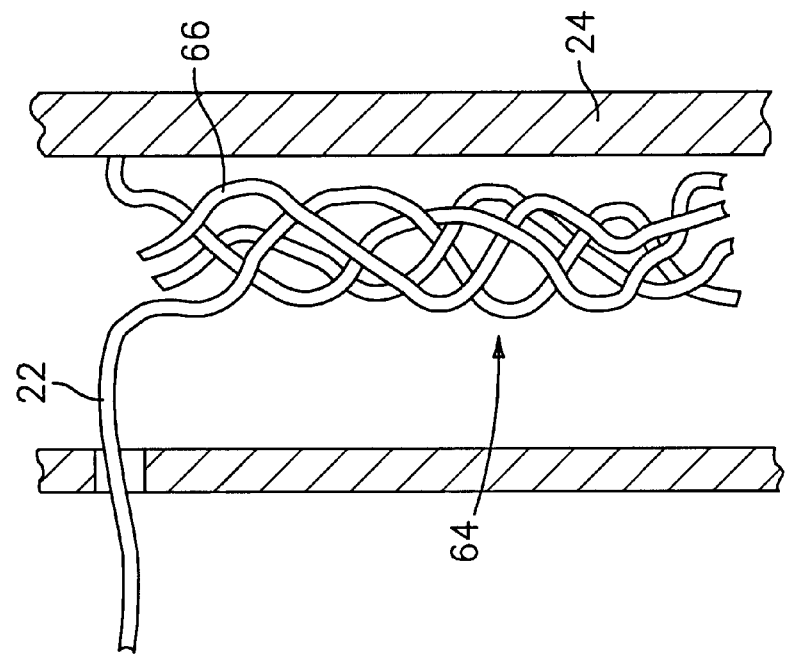
FIG. 12 schematically illustrates a braking system in accordance with an embodiment of the invention.

Constant braking is achieved by any suitable means. FIG. 12 illustrates one embodiment where the deceleration cable 22 engages a ripcord 64 anchored to the brake system 24. The ripcord 64 is a plurality of intertwined fibers 66 that require a constant force to unravel. A suitable ripcord is intertwined fibers of nylon or aramid fiber (e.g., KEVLAR fibers by E.I. duPont de Nemours & Co. ("duPont"), Wilmington, Del.) requiring a constant force of between about 2000 pounds and about 8000 pounds to unravel depending on the vehicle to be stopped. It is anticipated that about 120 feet of ripcord 64 would be required to bring a vehicle travelling at 60 miles per hour to a stop within desired less than 2 g deceleration.

Figure 13:
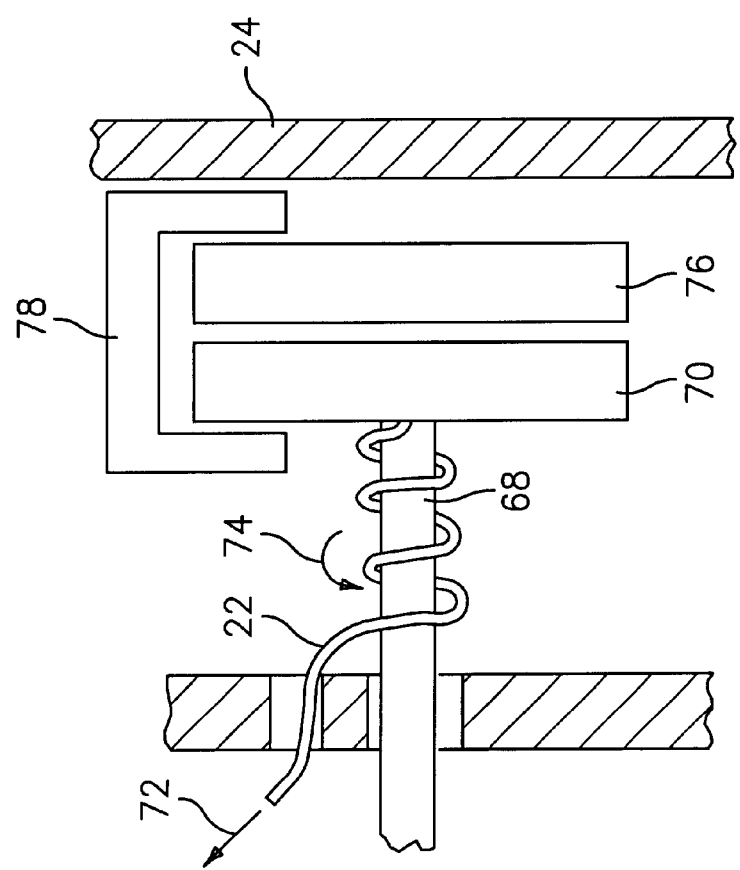
FIG. 13 schematically illustrates a braking system in accordance with a second embodiment of the invention.

A second embodiment, illustrated in FIG. 13, is similar to a conventional automobile braking system. The deceleration cable 22 is wound around a shaft 68 of a first metal plate 70. Engagement of the deceleration cable by impact of the barrier by a vehicle (reference arrow 72) causes the shaft to rotate (reference arrow 74) rotating the first metal plate 70. The first metal plate 70 engages a friction plate 76. Friction between the first metal plate 70 and the friction plate 76 provide the braking action. Hydraulic, electric, water brakes and torque converters are also suitable braking systems.

A governor 78 determines the rate of deceleration by varying the friction between the first metal plate 70 and the friction plate 76. Preferably, the deceleration rate does not exceed about 2 g. The friction required to safely decelerate a moped is much less than that required to stop a fully loaded truck.

While telescoping supports are described herein, other rapidly extending structures such as pistons and tractor rockets may also be used. The selection of the support structure is dependent on both the intended application and the size of the vehicle to be immobilized.

While the barrier enclosure is described as a speed bump extending above the surface of a pathway, it is within the scope of the invention for the barrier enclosure to be embedded either in the pathway surface or underground below the pathway surface.

While the barrier and the brake system are illustrated as aligned, they may also be offset.

The entire vehicle immobilization system is transportable in a pick-up truck or similar vehicle. It is believed the entire system could be easily installed and removed by a two person crew.

Figure 14:
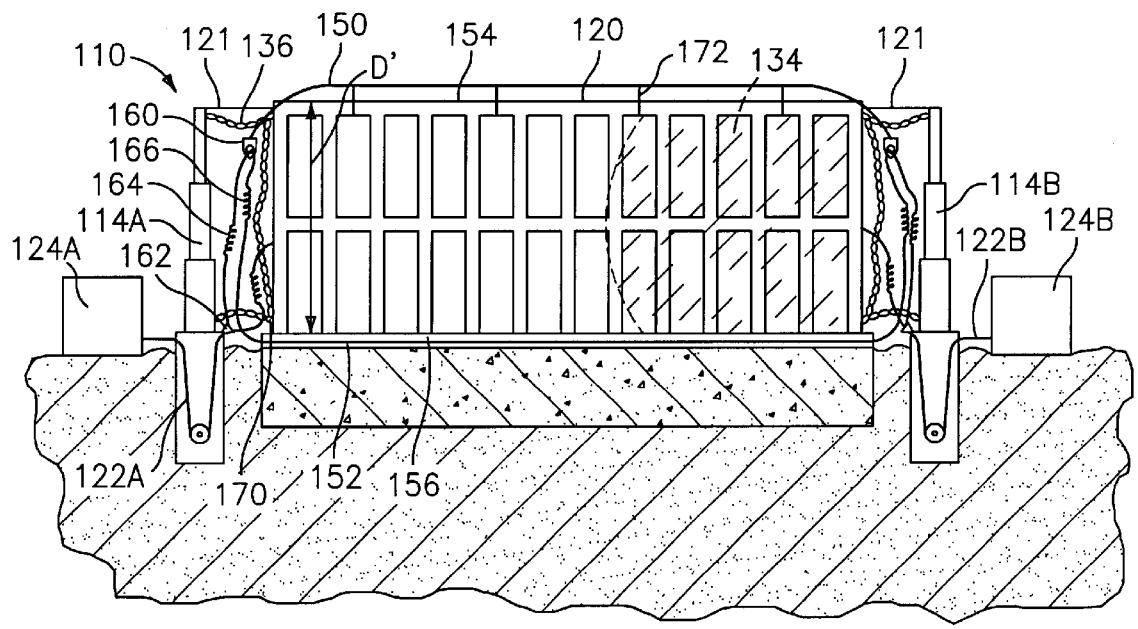
FIG. 14 illustrates in partial cross-sectional representation an alternate device of the invention in a deployed condition.

FIG. 14 shows an alternate transportable barrier system 110 which includes a vehicle capture feature that both prevents escape of a vehicle which has collided with the barrier and prevents escape of occupants from such a vehicle. The stowed condition of the system 110 may be otherwise similar to that of the device 10 of FIG. 10 et al. The device 110 includes a pair of fore and aft capture lines 150 and 152, respectively, so named due to their relative positions when a vehicle is captured as described below. In the deployed, pre-impact condition of FIG. 14, the fore capture line 150 is held proximate the top of the barrier 120. This may be done by coupling the line 150 to the breakaway cords 121, or by other means such as securing the line to an upper section 154 of the barrier 120 such as via hook and loop fastener (not shown), short frangible bands (not shown), and the like.

The aft capture line 152 is, advantageously, not secured along its length to the lower portion 156 of the barrier 120. The line lies proximate the ground surface or barrier enclosure (not shown) to allow the vehicle to override the line 152 as described below. At its respective left and right ends, the line 150 is secured to the housing of a "rope ratchet" 160. The rope ratchets 160 may be generally similar to a mountaineering ascender such as the ROPEMAN ascender available from Wild Country Ltd. of Center Conway, N.H. The line 152 passes through each rope ratchet 160. Each rope ratchet functions so that the line 152 may be drawn therethrough in only a single direction. For each rope ratchet 160, the line 152 may only be drawn through in a direction away from the center of the line 152. For purposes of reference, for each side of the system an upstream direction along the line 152 is defined as toward the center of the line 152 (i.e., between the rope ratchets 160) and a downstream direction is defined as opposite thereto. At its respective left and right ends, the line 152 is secured to the respective left and right deceleration cables 122A, 122B via a frangible coupling or link 162. On each side of the barrier, downstream of the associated rope ratchet 160 (i.e., between the rope ratchet 160 and the associated link 162), there may be an accumulation or slack 164 in the line 152. Similarly, upstream of each rope ratchet 160 there may be another accumulation or slack 166 in the line 152.

Figure 15:
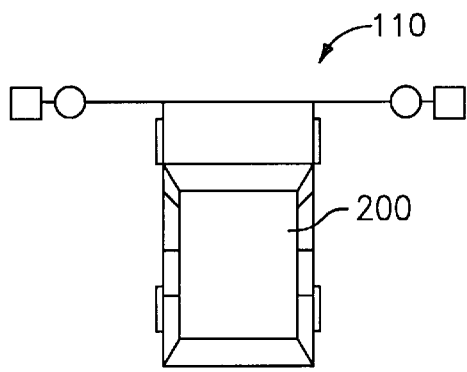
FIGS. 15–19 illustrate in top schematic representation the device of FIG. 14 in various stages of engagement to a target vehicle.
Figure 16:
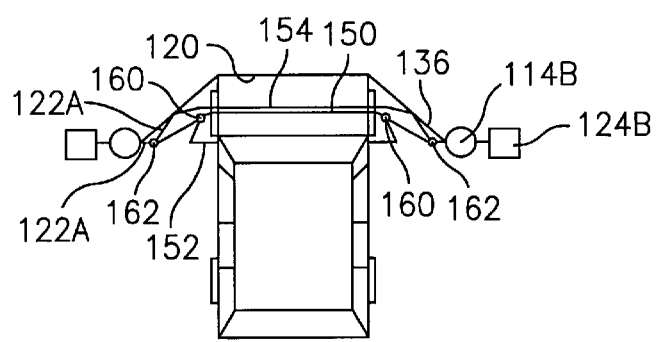

The barrier system 110 may be deployed in similar fashion to the device 10. Once deployed, a vehicle 200 may impact the barrier system. FIG. 15 shows the beginning of an initial impact phase. The vehicle's impact draws the barrier 120 forward (i.e., in the direction of motion of the vehicle). Forward movement of the barrier 120 ruptures the breakaway cords 121 (FIG. 14) and begins to extend the elastic cords 136 (FIG. 16). The breakaway cords may have a relatively low rupture tension as they need only have sufficient strength to erect and hold the barrier prior to impact. An exemplary breakaway cord is a DACRON (trademark of duPont) polyester line with a preferred rupture tension of about 50–150 pounds and more preferably about 90 pounds. The elastic cords 136 maintain the barrier 120 engaged to the vehicle, preventing the barrier from slipping over or under the vehicle. The elastic cords or their equivalent are optional, having a primary advantage of maintaining engagement between the barrier and vehicle at relatively low impact speeds (e.g., below about 25 mph). Above such a speed the momentum of the vehicle and inertia of the barrier may sufficiently maintain engagement between the two. Forward movement of the vehicle also brings the line 150 forward along with the barrier. Initially, the accumulation or slack 166 is extended, allowing the center portion of the line 152 to remain in position between the supports 114A and 114B. Similarly, the slack 164 is extended as is an accumulation or slack 170 (FIG. 14) in the deceleration cable between the link 162 and the barrier 120. Extension of the accumulations 164 and 170 allow the barrier and line 150 to be drawn forward without acting on the brakes 124A and 124B.

Figure 17:
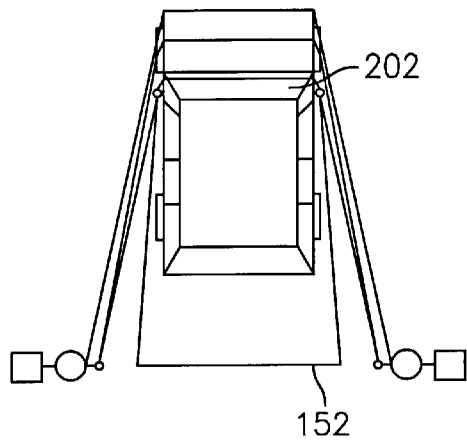
Figure 18:
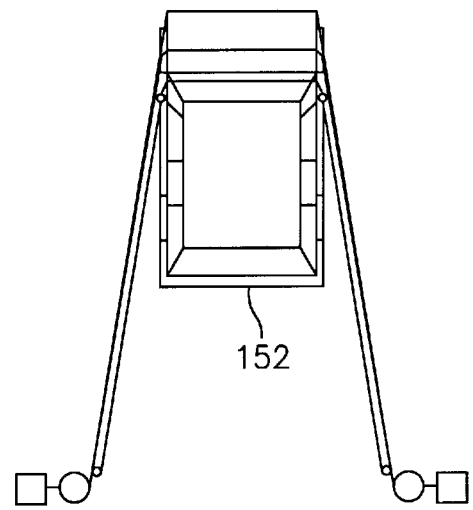
Figure 19:
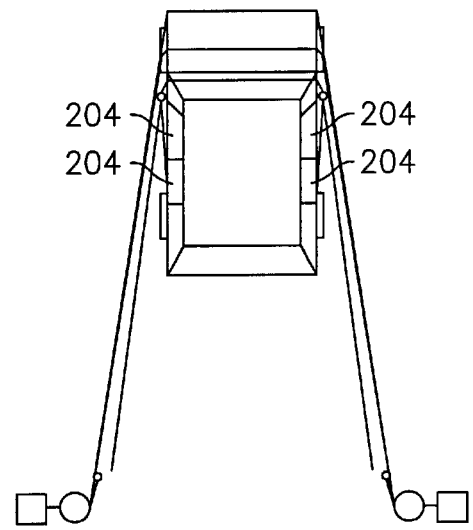
Figure 24:
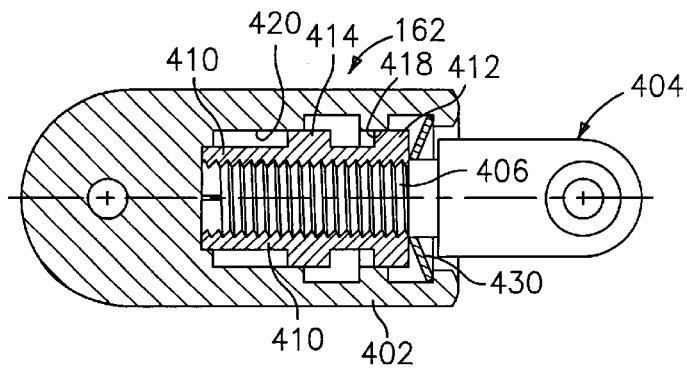
FIG. 24 is a partial longitudinal cross-sectional view of a frangible link.
Figure 25:
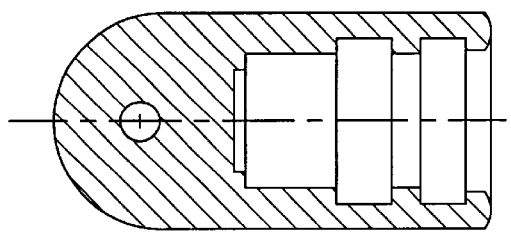
FIG. 25 is a longitudinal cross-sectional view of the body of the link of FIG. 24.

As the vehicle 200 proceeds forward from the point of impact, it draws the barrier 120 forward as well, wrapping the barrier over the front of the vehicle. For many vehicles having a hood lower than a cab, the barrier will wrap over the hood, with the upper section 154 and the fore line 150 being relatively back along the hood or even engaged to the cab. Optionally, a plurality of ties 172 (FIG. 14) may couple the line 150 to the upper section 154 of the barrier 120 so that the line 150 is constrained to stay within the lengths of the ties away from the upper section of the barrier. In the absence of such ties 172, the vehicle will proceed under the fore line 150 until the fore line 150 engages an appropriate partially vertical surface such as the windscreen 202 of the cab of the vehicle (FIG. 17). However the fore line 150 is engaged to the vehicle (via direct physical contact or via the barrier), the vehicle can proceed forward to a position shown in exemplary fashion in FIG. 17. To this point, the central section of the aft line 152 has remained in place along the ground or along or within the enclosure. The central section of the aft line 152 may be held in place via hook and loop fastener, adhesive or other frangible connection such that it may break loose when sufficient force is applied. To this point, the central portion of the aft line 152 has been allowed to remain in place as the accumulations or slack 164 and 166 in the aft line downstream and upstream of the associated rope ratchet 160 have been expended. The amount of line in the accumulations 164 and 166 may be identical or otherwise set so that they are simultaneously fully expended. Similarly, the accumulation 170 will have been to some extent expended (preferably only partially) during the foregoing interval. When the accumulations 164 and 166 are fully expended, further forward movement of the vehicle will place tension on the outboard portions of the aft line 152 between the rope ratchets 160 and the links 162. This tension draws the line 152 downstream through the rope ratchets 160 along each side thus increasing the lengths of line between the rope ratchets 160 and the links 162 while decreasing the length of the aft line 152 between the two rope ratchets 160. This draws the aft line 152 toward the vehicle as shown in FIG. 18. Eventually, the aft line 152 draws tight around the vehicle. The aft line 152 may engage the rear of the vehicle or may be drawn under the vehicle whereupon its contact with the moving rear wheels of the vehicle causes the aft line to be drawn over the wheels and thus wrapped around the rear axle or other rear suspension components (described below). Once firmly engaged, no further portion of the aft line 152 can be drawn through the rope ratchets 160. Thus, the portions of the aft line 152 between the rope ratchets 160 and the associated links 162 can extend no further, initially greatly increasing the tension in such portions beyond the threshold tension for the frangible links 162, severing the ends of the aft line 152 from the links 162 (FIG. 19). An exemplary threshold tension for the frangible links 162 is about 2500 pounds. A broader range such as 500–5000 pounds may be used depending upon factors such as the size of the barrier, the friction in the ratchet mechanisms, the line materials, and the mass and speed of the target vehicle.

Figure 20:
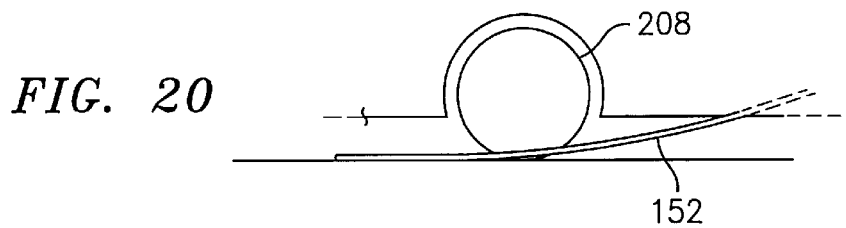
FIGS. 20–23 illustrate in partial side schematic representation the interaction of a capture line of the device with the rear wheels of a target vehicle during various stages of capture.
Figure 21:
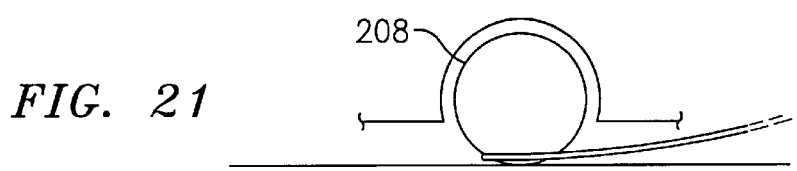
Figure 22:
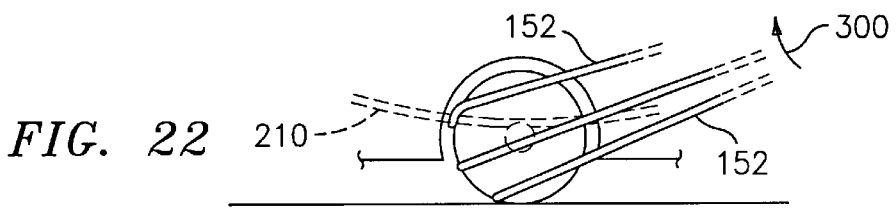
Figure 23:
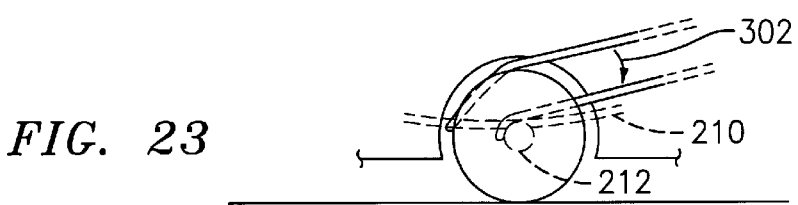

The entanglement with the vehicle suspension is further illustrated in exemplary fashion in FIGS. 20–23. FIG. 20 shows the relatively slack aft capture line 152 being tensioned toward the right rear wheel/tire combination 208 of the vehicle. FIG. 21 shows the aft capture line just as it begins to engage the bottom of the tire. Upon engagement, as the loop is further constricted and the tension in the aft capture line 152 increased, frictional or other gripping engagement between the aft capture line 152 and the tire causes the aft capture line to stick to the tire and rotate with the tire (in the clockwise direction for the right wheel and in the counterclockwise direction for the left wheel). Thus the line goes taut and is drawn in the direction 300, pivoting about an engagement point defined by the contact of the fore line 150 with a partially forward facing surface of the vehicle. Eventually as the aft capture line 152 is wrapped over the wheel/tire, it will engage a suspension component such as a leaf spring 210. Further forward motion of the vehicle and rotation of the wheel/tire 208 brings a portion of the aft capture line 152 over the top of the tire while the line is engaged to the suspension component. From this position, the line 152 may snap over the wheel tire and move generally downward in a direction such as 302, with the exemplary line drawing closer around the leaf spring 210 and into engagement with the axle 212. At this point, frictional engagement between the wheel/tire 208 and the line 152 may not be sufficient to disengage the line from the vehicle if the car is driven in reverse thus, preventing disengagement of the vehicle from the loop.

In the exemplary embodiment, heretofore the elastic cords 136 have stretched, holding the barrier engaged to the front of the vehicle while the slack 170 in the deceleration cables 122A, 122B has been gradually expended. Once the slack is fully expended, the deceleration cables go taut and act upon the brakes 124A and 124B which apply a resistive braking force while allowing extension of the deceleration cables (such as by unrolling from a spool coupled to a brake disk). The braking action dissipates the kinetic energy of the vehicle and/or the resistive braking force applied by the brakes overcomes any further driving force from the vehicle, bringing the vehicle to a complete stop. Should the driver attempt to back the vehicle out of engagement with the barrier, ideally a coupling of the capture lines to the barrier (such as via the ties 172) will prevent such disengagement.

A loop defined by the fore capture line 150 and the portion of the aft capture line 152 between the rope ratchets 160 has become tightly wrapped around the vehicle. The ratcheting action of the rope ratchets 160 prevents upstream movement of the aft capture line 152 thus preventing expansion or loosening of the loop encircling the vehicle. With the loop wrapped around the vehicle windscreen and the side doors 204 of the vehicle, escape of the vehicle occupants is prevented as the loop blocks any attempt to open the doors. Law enforcement personnel may then obtain access to the vehicle via cutting the loop or by manually releasing the ratchet member (not shown) of at least one of the rope ratchets 160.

A wide variety of the dimensions and other properties of the various system components may be determined to provide particular operating parameters. One important dimension is the length of the fore capture line 150. In the embodiment illustrated in FIGS. 16–19, the length is relatively short. The length may be need to be limited relative to the size of the target vehicle sought to be captured. For example, if the overall width of the barrier system of FIG. 16 was uniformly increased (including increasing the length of the line 150), when the vehicle is captured, the positions of the ratchets 160 will be relatively farther back along the vehicle. Thus a relatively larger portion of the loop is comprised of the forward capture line 150 and a relatively smaller portion by the segment of the line 152 between the ratchets 160). Since the size of the loop is dictated largely by the vehicle size and geometry, for effective capture, the length of the fore capture line 150 is thus limited and is advantageously at most the length of the loop along the front and sides (but not the back) of the vehicle. Preferably the length of the fore capture line 150 will be about half the length of the loop, although in the illustrated embodiment of FIG. 16 it is less than that size. Thus, in cases where a relatively wide barrier is used, the fore line 150 may extend only along a limited central portion of such barrier, with portions of the aft capture line 152 upstream and downstream of the rope ratchets 160 running along the remaining outboard portions of the barrier.

Referring to FIGS. 15–19, it can be seen that the as the vehicle impacts and moves the barrier, there is initially a high leverage of the vehicle relative to the barrier. Initially, the brake or deceleration lines are nearly perpendicular to the direction of travel of the vehicle so that incremental movement of the vehicle produces a smaller incremental movement of the deceleration lines and that the longitudinal stopping force applied to the vehicle is much less than twice (since there are two deceleration lines) the tension in the deceleration lines. As the vehicle proceeds, the angle between the direction of travel and the deceleration lines decreases from the initial value of approximately 90 degrees toward zero and the stopping force nears twice the tension in the lines. Geometrically, the stopping force will theoretically be twice the tension multiplied by the cosine of the angle. This geometry factor combines with properties of the braking system described below to ensure a smooth application of stopping force with a range of vehicle masses and velocities and within a desired range of deceleration. This is seen in plot 602 on FIG. 29 which shows the percentage of the tension in a given one of the two deceleration lines that is applied to the vehicle as a longitudinal stopping force. The example in FIG. 29 utilizes an exemplary pathway of about 6.7 meters in width and plots percentage vs. longitudinal distance (d) in meters along the pathway from the point of vehicle impact with the barrier.

Figure 29:
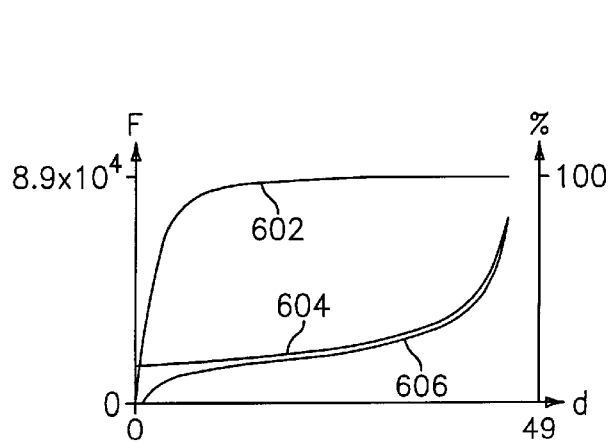
FIG. 29 is a graph relating stopping force to distance for an exemplary barrier system.
Figure 30:
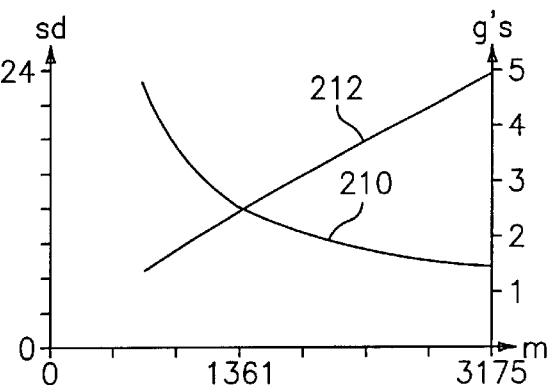
FIG. 30 is a graph relating stopping distance and peak deceleration to vehicle mass for an exemplary barrier system.
Figure 31:
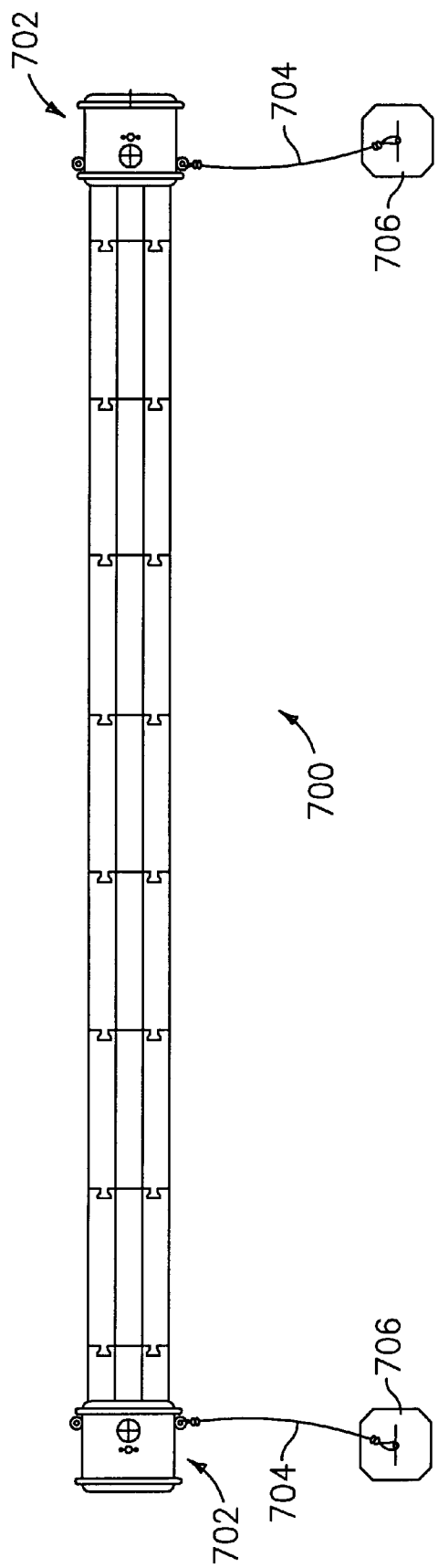
FIG. 31 is a top view of an alternate device according to principles of the invention in an undeployed condition.

As described above, the deceleration line may be wound around a shaft, spool or the like coupled to a brake (e.g. a disk or drum brake). The line initially exits the shaft at a first radius. As the line unwinds, the radius decreases. As the radius decreases, the leverage of the line relative to the brake decreases. Thus, as the line unwinds, the shaft rotation associated with a given linear extension of the line increases. In a given radial increment of the wound deceleration line, a greater length of line is contained at larger radii than at smaller radii. Accordingly, not only does the braking force increase as the deceleration line is unwound, the rate of increase (measured relative to the extension) increases as well, very rapidly increasing as the end of the roll of deceleration line is approached at a maximum possible extension (it being noted that the system is advantageously designed to not experience maximum extension under any expected impact). FIG. 29 further shows a plot 604 of deceleration line tension vs. longitudinal distance for an exemplary system. The tension, measured as a force ("F"), is shown on the left axis measured in Newtons. A net longitudinal applied stopping force (for the single brake box) is further shown by plot 606 and reflects the tension 604 multiplied by the geometric factor 602. The shape of this stopping force curve tends to ensure that vehicles having a relatively wide range of masses and impact speeds are stopped with peak decelerations within a target value such as about two or two and one half times the acceleration due to gravity. Plot 610 of FIG. 30 shows the deceleration in "g's" vs. vehicle mass m in kg at a fixed impact speed of about 80 km per hour (kph)(50 mph). Plot 612 shows the stopping distance ("sd") in meters for such vehicles. Clearly, such vehicles moving at lower speeds would be subject to lesser deceleration. Furthermore, an optional smart system could add further flexibility by utilizing input from a sensor which measures (directly or indirectly) the speed at which the deceleration lines are unwound. From this information, a controller can determine an initial impact speed and, based upon initial changes in the rate of such deployment, determine vehicle mass and, responsive thereto, modulate the braking force (via controlling the applied force on brake shoes, pads, or the like) to decelerate a vehicle in a desired fashion (for example, minimizing the stopping distance while maintaining deceleration within an acceptable level).

Although many approximations above have been based upon an assumed constant braking force (i.e., a constant resistive torque on the spool or shaft holding the brake line, actual results may differ from this. For example, an increase in brake pad temperature during extension of the deceleration lines may increase the coefficient of friction between the pad and the associated disk and thereby increase the resistive torque applied to the shaft or spool. Such an effect may further exaggerate the shape of the plot 604 and may also make such plot sensitive to vehicle speed. As a faster vehicle withdrawing the deceleration line more quickly will result in a more rapid increase in temperature friction than does a slower vehicle. This effect may provide additional compensation for vehicle speed.

The parameters of the braking mechanism including the absolute and relative values of the initial and minimum radii may be tailored not only to achieve given deceleration parameters but may also be tailored to maintain the deceleration line tension within a range for which there is sufficient anchoring of the system. For example, one embodiment 700 of the system shown in FIGS. 31–40 places the braking systems in a pair of brake boxes 702 which may be placed atop the ambient terrain on opposite sides of the pathway and secured via cables 704 to appropriate anchoring 706. The telescoping actuators or supports 708 may be separately formed from the brake boxes and may, for example, be installable atop the brake boxes. The brake boxes may be anchored by securing anchoring cables from the brake boxes to any appropriate anchoring source, such as trees, road signs, vehicles or two anchors imbedded in the terrain. For example, anchoring plates 706 may be dug into shallow holes slightly uproad from the brake boxes (e.g. by a distance of up to a few meters). This distance allows the tension on the anchoring cables 704 connecting the brake box to the anchor to draw the anchor against the side of the hole, thereby preventing the anchor from pulling out of the hole providing effective restraint for the brake system.

Figure 32:
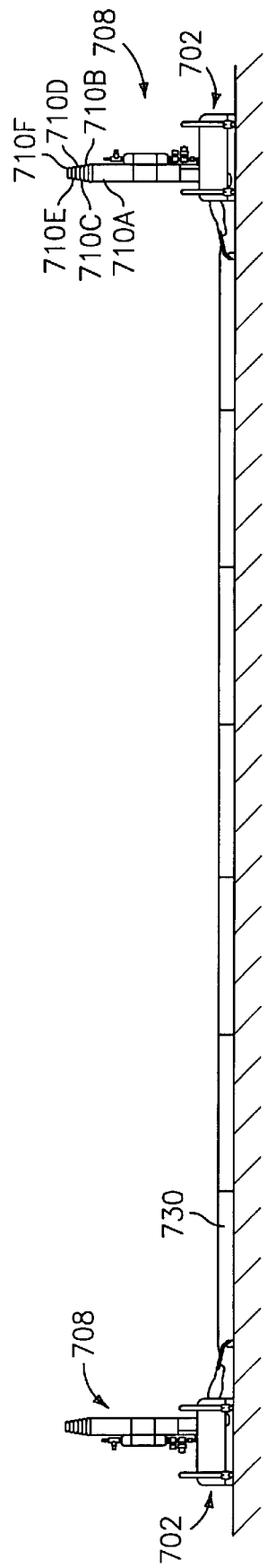
FIG. 32 is a front view of the device of FIG. 31.

Each support 708 includes a series of telescoping members or elements 710A–710F shown in a compressed condition in FIG. 32. To extend the supports, each support includes a gas source in the form of a compressed gas cylinder or bottle 712 secured via a plastic saddle 714 and hose clamps 716 to the lowermost/outermost element 710A. Upstream of the cylinder 712 is a fill valve 718. Downstream is a regulator 720 which is preferably included if the cylinder operates under a high pressure. An exemplary high pressure would be in the vicinity of 1800 psi while a low pressure would be in the vicinity of 120 psi. Further downstream is a solenoid valve 722 which may be electrically coupled to a control system (not shown). The solenoid valve serves to control the admission of gas from the cylinder 712 to the interior of the element 710A through a conduit 724. To allow the nested elements 710A–710F to be secured to the brake box, atop the brake box is a collar 726 which receives and accommodates the lower end of the element 710A, with the conduit 724 passing through a vertical slot 728 (FIG. 36) in the collar 726. When used in a low pressure mode, the cylinder 712 must be recharged after one or more uses such as via a hand pump or a compressor.

Figure 35:
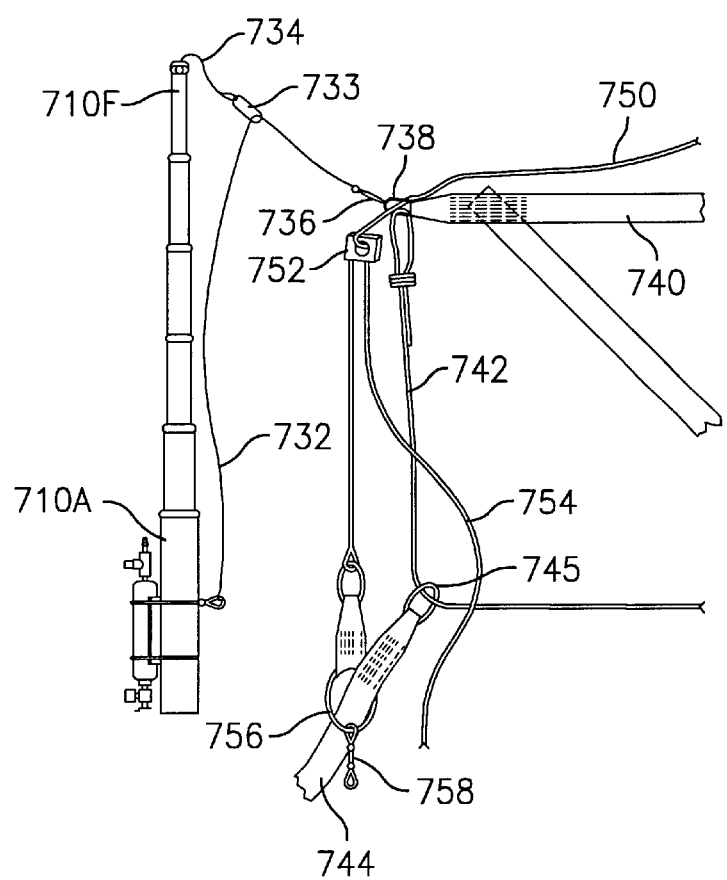
FIG. 35 is a view of an actuator of the device of FIG. 31 in a deployed condition.

Initially, the capture barrier or net and its associated lines are substantially stowed within the housing 730 which may be formed of assembled sections of a conventional cable protection system or have the enhanced features of the enclosure 26. As shown in FIG. 35, on each actuator a lift line 732 is secured at one end to the lowermost element 710A and extends slidably through a link 733 connected to the distal end of a lanyard 734 which, at its proximal end, is secured within the top of the uppermost element 710A. The other end of the lift line is connected to a breakaway link 736 which in turn is connected to an upper end ring or link 738. Optionally, instead of including a breakaway link 736, the lift line 732 may be disposable, formed of a material which tears at a desired threshold force which may be similar to the release force of the breakaway link. An example of such material would be a braided polyester material. Also connected to the upper end ring 738 are the adjacent end of the barrier top member 740 and the adjacent end of the barrier bottom member 742. Upon actuation of the system, as the uppermost element 710F moves upward relative to the fixed lowermost element 710A, the length therebetween increases, drawing the lift line 732 through the link 733 at the end of the lanyard 734. Tension within the lift line 732 raises the upper end ring 738 which brings with it the barrier. The distal end of the brake line 744 bears a ring 745 through which the bottom barrier member 742 extends. Tension applied by the brake line to the bottom member causes an end portion of the bottom member to extend nearly vertically from the ring 745 to the upper end ring 738 while a remaining portion of the bottom member extends across the pathway toward the opposite actuator elevated slightly above the housing.

The adjacent end of a front capture line 750 is secured to a rope ratchet 752. The rear or aft capture line 754 passes through the rope ratchet which is arranged so that the rear capture line can be drawn through the rope ratchet only in the direction which contracts the loop formed by the combination of the central portion of the rear capture line (between the ratchets) and the front capture line. The end of the rear capture line is coupled to a slider ring 756 which can slide along the brake line 744. The slider ring 756, and thus the rear capture line, are initially secured to the brake box (and thus to the anchor line) by a breakaway link 758.

Figure 33:
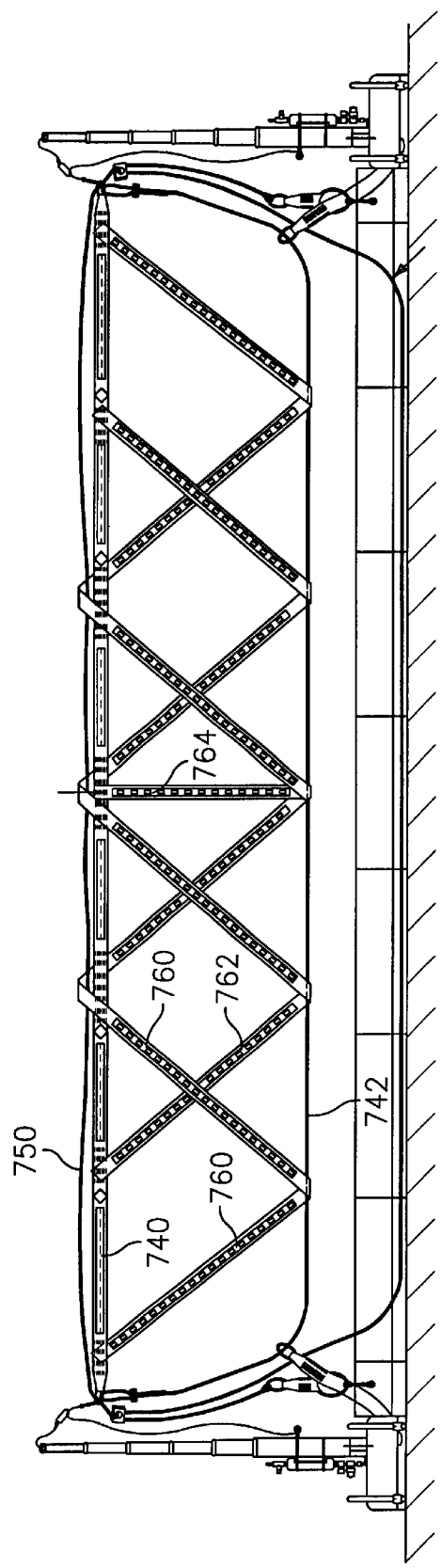
FIG. 33 is a front view of the device of FIG. 31 in a deployed condition.
Figure 34:
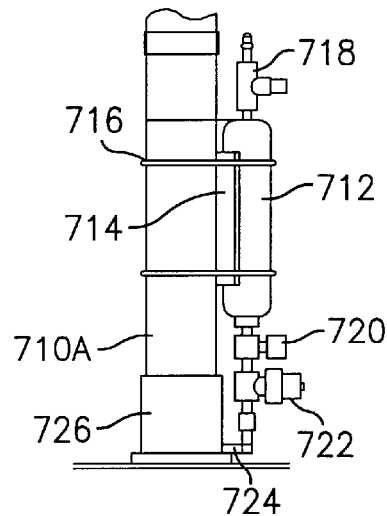
FIG. 34 is a view of an actuator of the device of FIG. 31.

As shown in FIG. 33, the top barrier member 740 is formed by a piece of high strength webbing material which extends across nearly from actuator to actuator. The body of the barrier between the top member 740 and the bottom member 742 is formed by criss-crossing diagonal webbing members 760 and 762 which cross multiple times between the top and bottom members to provide a series of criss-crossing web portions extending between upper and lower barrier members. At their ends, the members 760 and 762 are stitched to the top member 740. Where the members 760 and 762 pass over the top member 740, they are stitched thereto leaving a loop of excess material through which the front capture line 750 can freely pass. Where they fold over the bottom member 742, the members 760 and 762 may be stitched thereto or stitched to form a loop through which the bottom member may be free to slide. A central webbing member 764 extends vertically between the top member 740 and the bottom member 742, its upper end stitched to the top member and its bottom end stitched to the first criss-crossing member 760. The member 764 prevents a vehicle colliding with the barrier from being able to create and drive through a gap between the top and bottom members. Where the members 760 and 762 cross over each other, they are preferably not stitched to each other. This lack of direct securing of the members 760 and 762 to each other allows the barrier to better conform to a vehicle colliding with the barrier, the barrier wrapping around and forming a pocket around the front end of the vehicle. This allows the front tires of the vehicle to roll through the barrier and avoid damage to the net which might occur if the barrier were to be trapped between the tires and the ground.

Although a detailed capture sequence is not illustrated for the system 700, it can be readily appreciated how the system functions. Vehicle impact with the barrier fairly quickly releases the breakaway links 736 thus avoiding the exertion of any further forces upon the extended actuators. Progress of the vehicle draws the barrier around the vehicle and, eventually, starts withdrawing the brake lines from the brake boxes and drawing the rear capture line through the associated ratchets constricting the loop formed by the front capture line and central portion of the rear capture line around the vehicle until tension in the rear capture line is sufficient to release the breakaway links 758. Advantageously, the slider ring 756 is smaller than the ring 745 so that, were one of the barrier members (especially bottom member 742) to rupture, the ring 745 would not be drawn through the slider ring 756 but would become locked thereto, allowing the brake boxes to stop the motion of the vehicle via the capture lines only.

Figure 36:
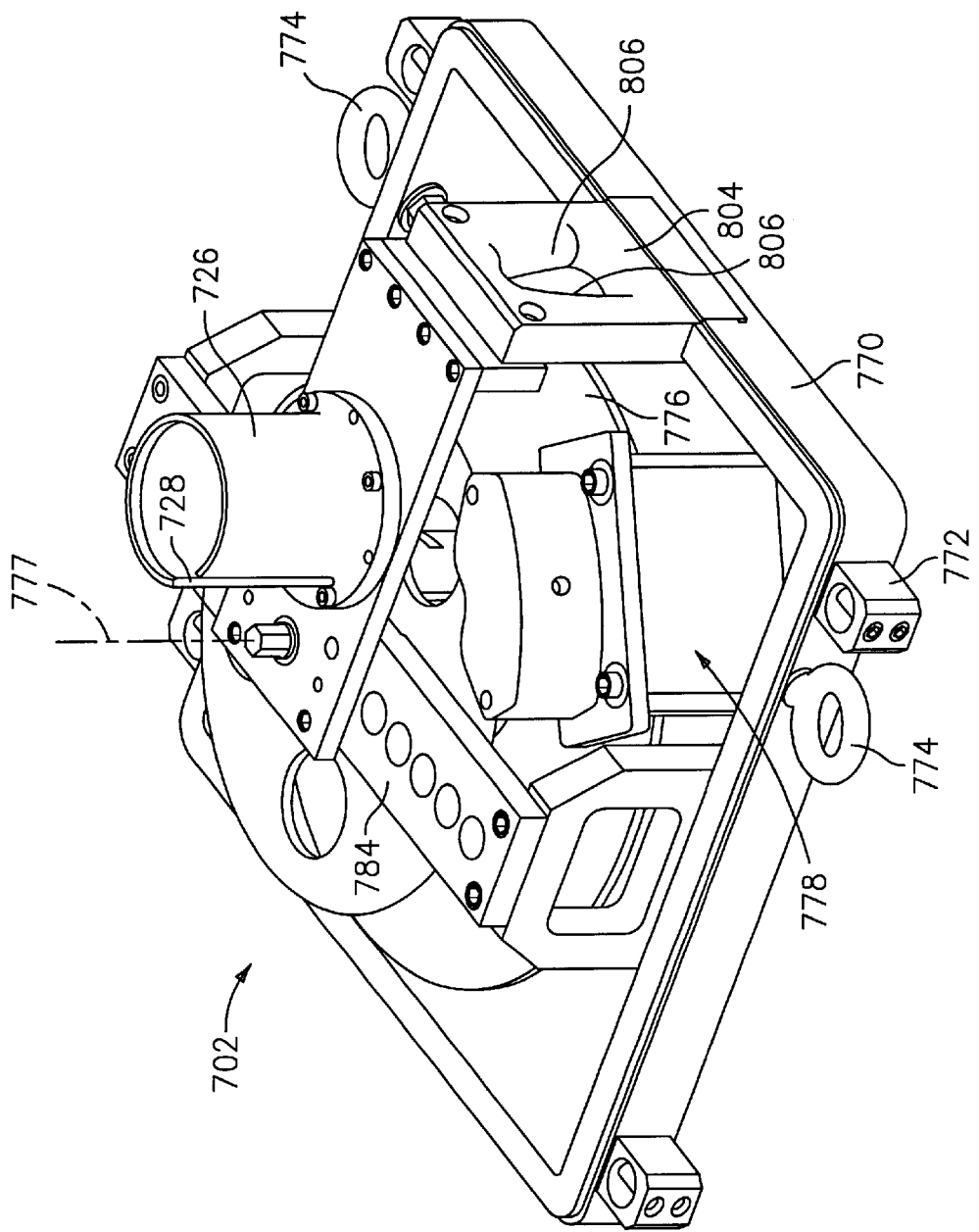
FIG. 36 is a view of a brake box of the device of FIG. 31 with a cover removed.
Figure 37:
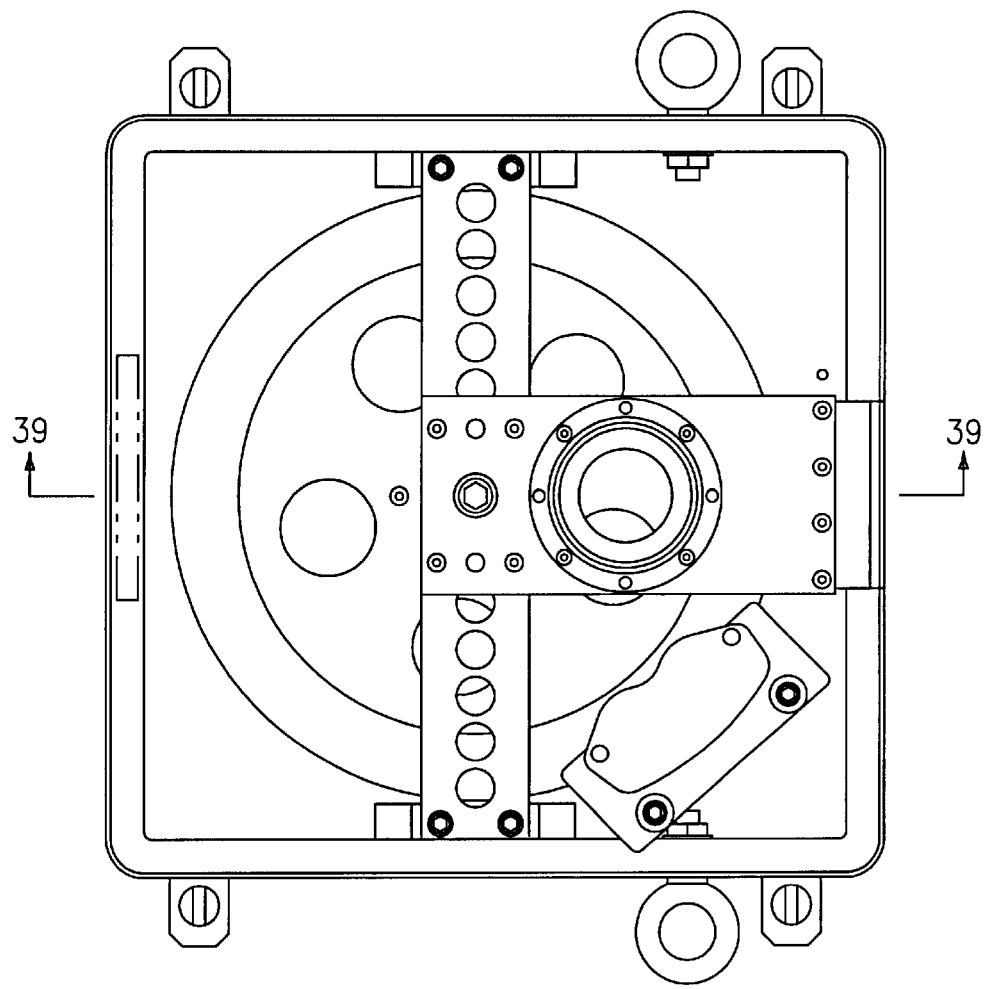
FIG. 37 is a top view of the brake box of FIG. 36.
Figure 38:
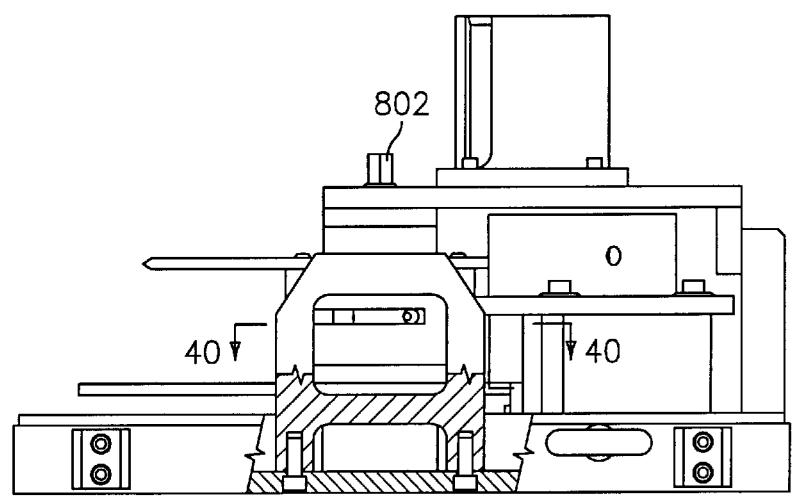
FIG. 38 is a front view of the brake box of FIG. 36.
Figure 39:
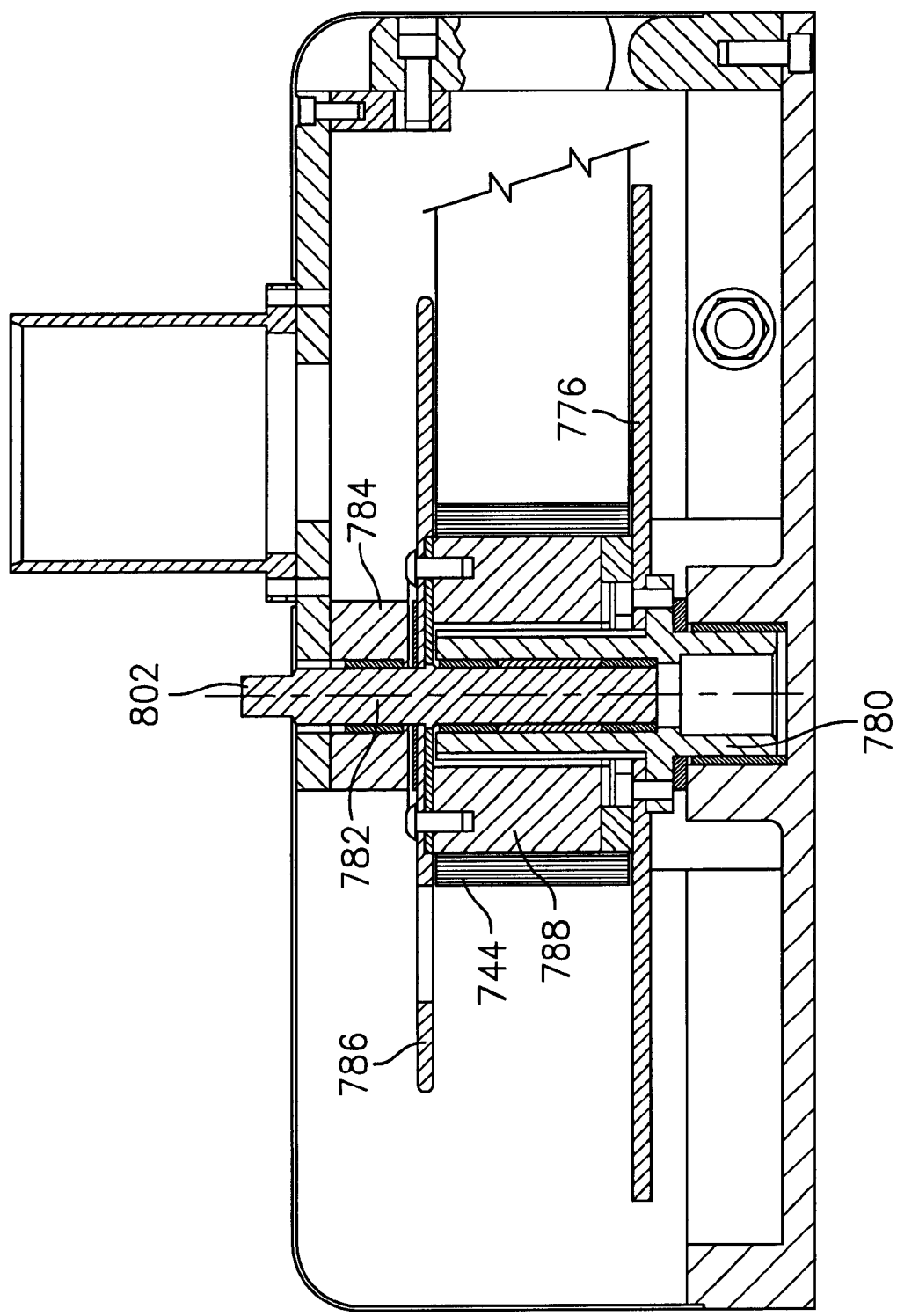
FIG. 39 is a cross-sectional view of the brake box of FIG. 37.
Figure 40:
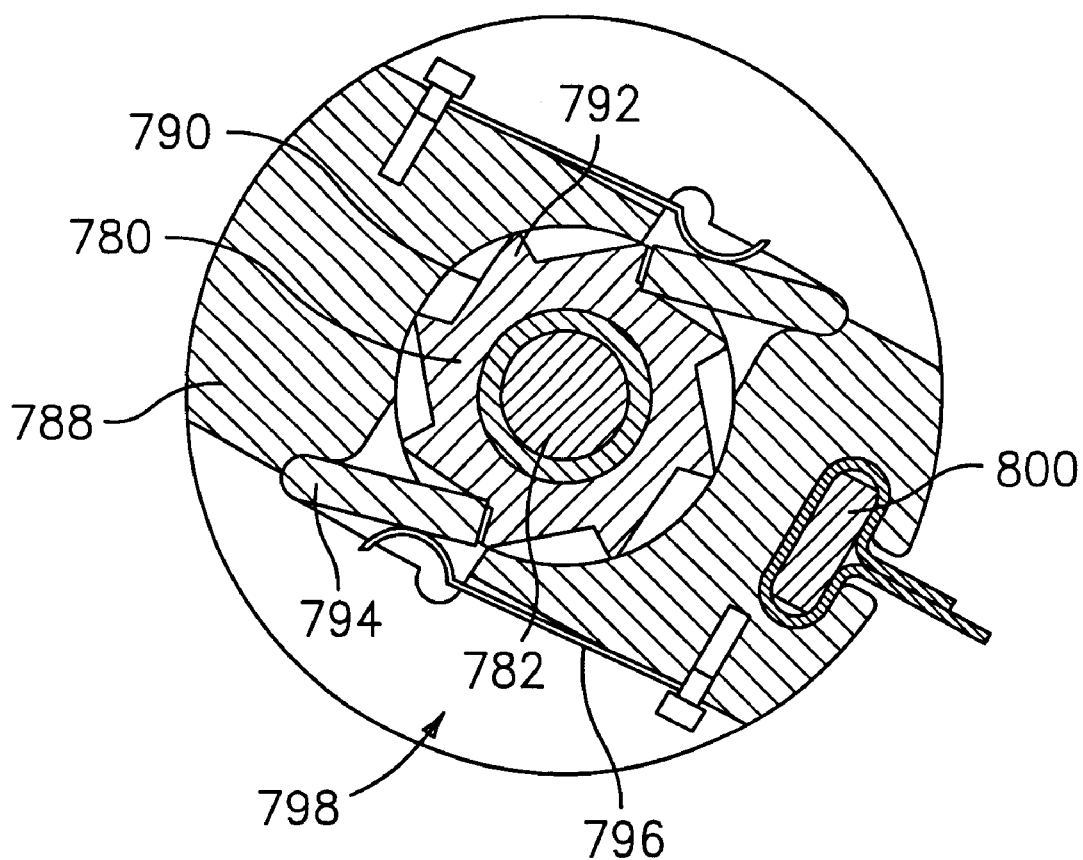
FIG. 40 is a cross-sectional view of the brake box of FIG. 38.

Turning now to FIG. 36, there can be seen further details of the brake boxes 702. Each box 702 includes a base member 770 to which are secured pairs of sockets 772 for receiving a pair of u-shaped protective bars (not shown)

which extend over the housing (not shown). Eye-bolts 774 allow the brake box to be secured to the anchoring and allow the breakaway link 758 to be secured to the brake box. A brake disk 776 is held for rotation about a vertical axis 777. A spring-loaded caliper system 778 applies a constant clamping force across the disk 776 which resists rotation of the disc about the axis 777. An axle system for rotatably supporting the brake disk is provided by outer and inner nested shafts 780 and 782 (FIG. 39). The lower end of the outer shaft is supported by a bearing in the base and an upper portion of the inner shaft is supported by a bearing in a bridge member 784 structurally integrated with the base. The disk 776 is secured to the outer shaft 780 such as by means of bolts extending through the disk and into a flange portion of the shaft. A lower portion of the inner shaft 782 is accommodated within an upper portion of the outer shaft 780 with bearings located in between. An upper end plate or disk 786 is located above the brake disk 776 and spaced apart therefrom. In between the two, is a hub 788. The end plate 786, hub 788 and brake disk 776 cooperate to form a spool around which the brake line 744 is wound. The end plate 786 and hub 788 are secured to the inner shaft 782. Optionally, a lower end plate (not shown) may be formed separately from the brake disk 776 and also secured to the hub. As shown in FIG. 40, an upper portion 790 of the outer shaft 782 located within the hub 788 is formed having ratchet teeth 792. A pair of dogs 794 are pivotally mounted within the hub and are spring biased into engagement with the ratchet teeth 792 by means of leaf springs 796 located within horizontal pockets 798 of the hub. As viewed in FIG. 40, the interaction of the dogs with the teeth prevents the hub from rotating counter-clockwise relative to the outer shaft 780 but allows the hub to substantially freely rotate clockwise relative to the outer shaft. FIG. 40 also shows the end of the associated brake line secured via a keeper 800 within a vertical slot in the hub. Accordingly, as the brake line is withdrawn from the brake box, unwinding of the brake line rotates the hub and, in turn, rotates the brake disk via locked action of the ratchet mechanism. After the vehicle has been captured and extracted from the barrier, to rewind the brake line a wrench or other device is applied to the hexagonal upper end 802 of the inner shaft (FIG. 38–39). The wrench rotates the inner shaft and hub clockwise as shown in FIG. 40, rewinding the brake line around the hub without rotating the brake disk. Thus, the ratchet mechanism allows the brake caliper to be continuously engaged to the brake disk without the need to provide a mechanism to disengage the brake.

Another feature of the brake box can be seen in FIG. 36 wherein a brake line outlet guide 804 has a pair of curved guide surfaces 806 which are angled approximately 15–20° from vertical, with the surfaces 806 converging at their upper ends. This inclination allows smooth exit of the brake line from the brake box and provides an efficient force path from the brake line through the brake box to the eye-bolt 774 and, therefrom, to the anchors. When the vehicle is being decelerated by the system, the brake line exiting the brake box and anchor line form nearly a straight line, transmitting force through the brake box with minimal movement of the brake box. Also, it is noted that the brake caliper is preferably mounted in the portion of the brake box between the guide 804 and eye-bolt 774 as this portion of the box may be made relatively robust to accommodate the force transmitted through the brake box. In the exemplary system 700, the exemplary size of the system is approximately 23–24 ft. between brake boxes (for two-lane coverage, a single lane system preferably being about 12–14 ft.). At such a size, a preferred system weight is well under 1,000 lbs. and approximately 600 lbs. in the example. Of this weight, approximately half is provided by the cable protectors which serve as the barrier enclosure. The brake boxes weigh approximately 115 lbs. each while the supports weigh approximately 25 lbs. each. The barrier weighs approximately 16 lbs. and the anchors weigh approximately 18 lbs. apiece.

Figure 26:
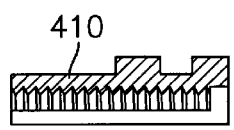
FIG. 26 is a longitudinal cross-sectional view of a split nut of the frangible link of FIG. 24.
Figure 27:
FIG. 27 is a front elevational view of the split nut of FIG. 26.
Figure 28:
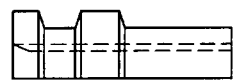
FIG. 28 is a side elevational view of the split nut of FIG. 26.

Optionally, the capture system may be further integrated with the barrier. For example, the fore capture line 150 may be formed as a portion of the barrier such as the upper section 154 (or even as an intermediate section of the barrier). Although, in the exemplary embodiment, the aft capture line 152 is connected via the frangible links 162 to the deceleration cables 122A and 122B, it may be otherwise secured. For example, the line 152 may be secured not to the deceleration cables 122A, 122B but rather to the supports 114A, 1141B or the brakes 124A, 124B directly or indirectly or to any other element which can supply enough resistance to hold the ends of the line 152 with enough resistive force to tighten the loop around the vehicle to a point where the tension in the loop is at a desired level. If frangible links such as links 162 are provided to couple the ends of the line 152 to the associated supporting elements, the links can be provided with a threshold tension associated with reaching the desired tension in the loop. FIGS. 24–28 show details of the frangible link 162. The link 162 includes a housing 402 and an eyebolt 404 coupled to the deceleration cable and aft capture line, respectively. In the exemplary embodiment, the eyebolt has a threaded shaft 406 of one-half inch nominal diameter with a UNC coarse thread. The shaft 406 is engaged to the internal threads of a split nut comprising a pair of identical longitudinally-separated halves 410. The nut comprises a generally cylindrical body with a pair of protuberances projecting radially outward therefrom. A fore protuberance 412 is located at the fore end of the nut and an aft protuberance 414 is located generally in a middle portion of the nut. The protuberances each have fore and aft annular faces and a cylindrical perimeter therebetween. The cylindrical perimeters have a radius slightly smaller than a radius of the housing compartment defined by an aft cylindrical section 420 and a fore cylindrical section 418. In a locked condition, the cylindrical surfaces of the protuberances 412 and 414 contact the surfaces 418 and 420, respectively to prevent radial outward movement of the two halves 410 so that the eyebolt 404 remains longitudinally secured to the split nut. The nut is biased into this locked condition via a belleville spring washer 430 which in the exemplary embodiment has a 1.5 inch outer diameter and a nine-sixteenth inch inner diameter. Along its inner diameter, the spring washer engages the fore end of the split nut. Along its outer diameter, the spring washer engages an aft-facing annular wall of a fore compartment extending radially outward forward of the surface 418. A second annular compartment extends radially outward between the surface 418 and the surface 420. As tension is applied between the eyebolt and housing, the spring compresses as the eyebolt and nut are drawn forward. When the threshold tension is achieved, the protuberances 412 and 414 are aligned with the compartments fore and aft of the surface 418 and the camming action between the threads of the eyebolt and the threads of the split nut forces the halves apart, allowing the eyebolt to pull free of the split nut. As shown in FIGS. 26 and 27, the threaded portion of each nut half 410 is cut back from the plane 500 at which the two halves mate. This reduces the radial distance by which the halves must be forced apart to free the eyebolt. In the exemplary embodiment, the threads are cut back on each side of the half by a distance from the plane 500 of about one-third of the eyebolt radius. Once the eyebolt is released, the spring washer forces the split nut back to the retracted or locking position. A camming action of angled aft annular faces of the protuberances with similar angled fore facing annular faces of the compartments fore and aft of the surface 418 directs the two halves radially inward toward each other as the spring washer pushes them aft. To reconnect the eyebolt 404 to the split nut, it need only be screwed into the split nut, and does not therefore need to be forced in. It can be seen that although each of the four identified inclined camming shoulders is angled to converge in an aft direction, less than all may be so configured. For example, only one pair may be engaged to each other and only one shoulder of that pair need have the identified inclination to achieve the desired camming effect.

An advantage of the use of a break-away link 162, which is resettable without the need for replacement parts, in combination with a pneumatic actuation system and a friction brake (rather than a ripcord) is that the entire barrier system may be reset after it has been used without the need for replacing parts. This can be the case whether or not a vehicle has impacted the barrier.

It may be further possible to integrate the capture feature with the barrier. For example, a full integration could be achieved via coupling the barrier to the deceleration cables only via the aft capture line.

It is apparent that there has been provided in accordance with this invention a transportable device for immobilizing a land vehicle that fully satisfies the objects, features and advantages set forth hereinabove. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A device for capturing a target vehicle travelling along a pathway, comprising:
   first and second support members;
   a first elongate flexible member which, with the device in at least a deployed condition, is held extending at least partially between said first and second support members at a first height profile that is effective to engage the target vehicle as said target vehicle passes between the support members;
   a second elongate flexible member which, with the device in at least the deployed condition, is held extending at least partially between said first and second support members at a second height that is effective to allow the target vehicle to pass over a central portion of the second elongate flexible member as said target vehicle passes between the support members;
   first and second couplings secured to the first elongate flexible member and receiving the second elongate flexible member so that the first elongate flexible member, the first and second couplings, and a portion of the second elongate member spanning the first and second couplings collectively define a closed loop;
   wherein the second elongate member has first and second portions respectively beyond the first and second couplings, the first and second portions held relative to the pathway so that, at some point by which the target vehicle has passed over the central portion of the second elongate flexible member, the cog forward by the target vehicle of the first elongate flexible member produces tension in the first and second portions causing the second elongate member to be drawn through each of the first and second couplings in an associated direction which causes the closed loop to constrict about the target vehicle.

2. The device of claim 1 characterized in that the first and second portions are held relative to the pathway via first and second frangible links which release the first and second portions when said tension in the first and second portions exceeds a threshold tension.

3. The device of claim 1 characterized in that the first and second elongate flexible members are substantially housed, prior to deployment, in an enclosure having a top characterized by at least one hinged cover element moveable from:
   a closed condition for storing the first and second elongate flexible members beneath the top and protecting the first and second elongate flexible members from vehicles passing over the enclosure, to:
   an open condition in which at least the first elongate flexible member may be deployed upward out of the enclosure.

4. The device of claim 1 characterized in that the first and second support members are each capable of being actuated from a compressed condition to an extended condition, the device further characterized by:
   a propulsion system effective to actuate said first and second support members from said compressed condition to said extended condition.

5. The device of claim 1 characterized in that the constriction of the closed loop around the target vehicle brings the closed loop into contact with at least one rear tire of the vehicle, whereupon farther rotation of said tire draws the closed loop up and over said tire, bringing the closed loop into engagement with a suspension component associated with said tire.

6. The device of claim 1 further comprising:
   first and second braking systems coupled to the first elongate flexible member and each including a rotatable member coupled to an associated brake resisting rotation of such rotatable member; and
   one or more lines, each wound around the rotatable member of at least one of the first and second braking systems and coupled to the first elongate flexible member so as to apply a stopping force to the target vehicle, the stopping force resulting from a resistive torque applied by the brakes to their associated rotatable members as the one or more lines are unwound.

7. The device of claim 6 characterized in that said first and second braking systems are effective to provide said vehicle with a deceleration rate of between 0.5 g and 3.0 g.

8. The device of claim 6 characterized in that said first and second braking systems are effective to provide said vehicle with a deceleration rate of between 1.0 g and 2.0 g.

9. The device of claim 6 wherein each of the first and second braking systems includes a ratchet mechanism permitting an associated one of said one or more lines to be rewound around the rotatable member while the associated brake is in an engaged condition.

10. The device of claim 6 wherein the first and second support members each comprise a series of telescoping cylinders which extend from a retracted condition to an extended condition to place the device in the deployed condition and wherein said first and second support members are respectively removably mountable atop the first and second braking systems.

11. The device of claim 1 wherein constriction of the loop blocks doors of the target vehicle.

12. A device for capturing a target vehicle travelling along a pathway, comprising:

first and second support members;

a first elongate flexible member which, with the device in at least a deployed condition, is held extending at least partially between said first and second support members at a first height profile that is effective to engage the target vehicle as said target vehicle passes between the support members;

a second elongate flexible member which, with the device in at least the deployed condition, is held extending at least partially between said first and second support members at a second height that is effective to allow the target vehicle to pass over a central portion of the second elongate flexible member as said target vehicle passes between the support members;

first and second couplings secured to the first elongate flexible member and receiving the second elongate flexible member so that the first elongate flexible member, the first and second couplings, and a portion of the second elongate member spanning the first and second couplings collectively define a closed loop;

wherein:

the second elongate member has first and second portions respectively beyond the first and second couplings, the first and second portions held relative to the pathway so that, at some point by which the target vehicle has passed over the central portion of the second elongate flexible member, the carrying forward by the target vehicle of the first elongate flexible member produces tension in the first and second portions causing the closed loop to constrict about the target vehicle; and the first and second portions are held relative to the pathway via first and second frangible links which release the first and second portions when said tension in the first and second portions exceeds a threshold tension, the first and second frangible links are each characterized by:

a housing;

a threaded shaft;

a segmented internally threaded member sized to receive the shaft in threaded engagement, the member shiftable between a retracted position within the housing in which the housing prevents radial expansion of the member sufficient to release the shaft and an extended position in which radial expansion is permitted sufficient to release the shaft;

a spring member biasing the internally threaded member from the extended position toward the retracted position;

wherein a tension between the housing and shaft greater than a threshold tension is effective to shift the threaded member to the extended position and release the shaft.

13. The device of claim 12 characterized in that said first and second couplings are first and second ratchets, respectively, which in at least a first condition permit movement of the second elongate flexible member through each such ratchet only in an associated direction which causes the loop to constrict.

14. A device for capturing a target vehicle travelling along a pathway, comprising:

first and second support members;

a first elongate flexible member which, with the device in at least a deployed condition, is held extending at least partially between said first and second support members at a first height profile that is effective to engage the target vehicle as said target vehicle passes between the support members;

a second elongate flexible member which, with the device in at least the deployed condition, is held extending at least partially between said first and second support members at a second height that is effective to allow both the front and rear pairs of tires of the target vehicle to pass over a central portion of the second elongate flexible member as said target vehicle passes between the support members;

first and second couplings secured to the first elongate flexible member and receiving the second elongate flexible member so that the first elongate flexible member, the first and second couplings, and a portion of the second elongate member spanning the first and second couplings collectively define a closed loop;

wherein the second elongate member has first and second portions respectively outwardly beyond the first and second couplings, the first and second portions held relative to the pathway so that, at some point by which the target vehicle front and rear pairs of tires have passed over the central portion of the second elongate flexible member, the carrying forward by the target vehicle of the first elongate flexible member produces tension in the first and second portions causing the closed loop to constrict about the target vehicle.

15. A device for capturing a target vehicle travelling along a pathway, comprising:

first and second support members;

a first elongate flexible member which, with the device in at least a deployed condition, is held extending at least partially between said first and second support members at a first height profile that is effective to engage the target vehicle as said target vehicle passes between the support members;

a second elongate flexible member which, with the device in at least the deployed condition, is held extending at least partially between said first and second support members at a second height that is effective to allow the target vehicle to pass over a central portion of the second elongate flexible member as said target vehicle passes between the support members;

first and second ratchets secured to the first elongate flexible member and receiving the second elongate flexible member so that the first elongate flexible member, the first and second ratchets, and a portion of the second elongate member spanning the first and second ratchets collectively define a closed loop;

wherein the second elongate member has first and second portions respectively beyond the first and second ratchets, the first and second portions held relative to the pathway so that, at some point by which the target vehicle has passed over the central portion of the second elongate flexible member, the carrying forward by the target vehicle of the first elongate flexible member produces tension in the first and second portions causing the second elongate member to be drawn through the ratchets in an associated direction which causes the closed loop to constrict about the target vehicle and wherein, in at least a first condition, the first and second ratchets permit movement of the second elongate flexible member through each such ratchet only in an associated direction which causes the loop to constrict.

* * * * *